(12) United States Patent
Iida et al.

(10) Patent No.: US 11,145,586 B2
(45) Date of Patent: Oct. 12, 2021

(54) INTERPOSER AND ELECTRONIC DEVICE

(71) Applicant: Murata Manufacturing Co., Ltd., Nagaokakyo (JP)

(72) Inventors: Kanto Iida, Nagaokakyo (JP); Hiromasa Koyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 31 days.

(21) Appl. No.: 16/861,731

(22) Filed: Apr. 29, 2020

(65) Prior Publication Data
US 2020/0258828 A1 Aug. 13, 2020

Related U.S. Application Data

(63) Continuation of application No. PCT/JP2018/038283, filed on Oct. 15, 2018.

(30) Foreign Application Priority Data

Nov. 1, 2017 (JP) .............................. JP2017-211580

(51) Int. Cl.
*H01L 23/498* (2006.01)

(52) U.S. Cl.
CPC .. *H01L 23/49833* (2013.01); *H01L 23/49822* (2013.01); *H01L 23/49838* (2013.01)

(58) Field of Classification Search
CPC ......... H01L 23/49833; H01L 23/49822; H01L 23/49838; H01L 23/49827; H01L 23/12; H05K 2201/10378; H05K 1/144; H05K 3/403

See application file for complete search history.

(56) References Cited

U.S. PATENT DOCUMENTS

| 10,806,033 B2 * | 10/2020 | Iida ........................ H05K 1/028 |
| 2002/0117753 A1 | 8/2002 | Lee et al. |
| 2005/0077546 A1 * | 4/2005 | Neaves .................. H01L 23/48 257/210 |

(Continued)

FOREIGN PATENT DOCUMENTS

| JP | 04-29337 A | 1/1992 |
| JP | 06-326475 A | 11/1994 |

(Continued)

OTHER PUBLICATIONS

Official Communication issued in International Patent Application No. PCT/JP2018/038283, dated Dec. 18, 2018.

*Primary Examiner* — Nicholas J Tobergte
(74) *Attorney, Agent, or Firm* — Keating & Bennett, LLP

(57) ABSTRACT

An interposer includes a stacked body including insulating base material layers that are stacked on one another, first and second electrodes, a conductor pattern, and an interlayer connection conductor. The stacked body includes a first mounting surface including a first electrode, and a second mounting surface facing the first mounting surface and including a second electrode. The first electrode is electrically connected to the second electrode through the conductor pattern and the interlayer connection conductor. A length of an electrical path including conductor patterns connecting the first electrode and the second electrode is larger than a total length of the interlayer connection conductor in a stacking direction.

25 Claims, 11 Drawing Sheets

(56) References Cited

U.S. PATENT DOCUMENTS

| | | | |
|---|---|---|---|
| 2012/0262862 A1* | 10/2012 | Johnson | H01L 23/4985 |
| | | | 361/679.02 |
| 2014/0003018 A1 | 1/2014 | Fujimori | |
| 2014/0234058 A1* | 8/2014 | Murata | H01L 21/67265 |
| | | | 414/222.01 |
| 2015/0091676 A1 | 4/2015 | Kato et al. | |
| 2016/0174304 A1* | 6/2016 | Kim | H01L 51/5253 |
| | | | 313/511 |
| 2017/0033426 A1 | 2/2017 | Baba et al. | |
| 2020/0205289 A1* | 6/2020 | Iida | H05K 3/363 |

FOREIGN PATENT DOCUMENTS

| | | |
|---|---|---|
| JP | 11-284342 A | 10/1999 |
| JP | 2001-077290 A | 3/2001 |
| JP | 2001-111195 A | 4/2001 |
| JP | 2002-314257 A | 10/2002 |
| JP | 2009-065008 A | 3/2009 |
| JP | 2012-186301 A | 9/2012 |
| WO | 2011/024469 A1 | 3/2011 |
| WO | 2014/002592 A1 | 1/2014 |
| WO | 2016/088693 A1 | 6/2016 |

\* cited by examiner

INTERPOSER AND ELECTRONIC DEVICE

CROSS REFERENCE TO RELATED APPLICATIONS

This application claims the benefit of priority to Japanese Patent Application No. 2017-211580 filed on Nov. 1, 2017 and is a Continuation Application of PCT Application No. PCT/JP2018/038283 filed on Oct. 15, 2018. The entire contents of each application are hereby incorporated herein by reference.

BACKGROUND OF THE INVENTION

1. Field of the Invention

The present invention relates to an interposer that connects a plurality of circuit boards or the like, the plurality of circuit boards each including a predetermined circuit, and to an electronic device including an interposer.

2. Description of the Related Art

With high integration of a circuit board and an electronic component provided in an electronic device, and also with a mixture of circuit boards that have different wiring densities, a structure in which a plurality of circuit boards are electrically connected through an interposer as necessary may be used.

For example, International Publication No. 2014/002592 discloses a structure in which a first element (a first circuit board) and a second element (a second circuit board) that are disposed at a distance in a thickness direction are electrically connected to each other, with an interposer interposed between the first element and the second element. The interposer includes a conductor pattern provided in a stacked body including a plurality of insulating base material layers and an interlayer connection conductor provided in the stacked body and extending in the thickness direction (a stacking direction in which the plurality of insulating base material layers are stacked on one another, a direction in which the first element and the second element is spaced from each other), and has a structure in which wiring to connect the first element and the second element by the conductor pattern and the interlayer connection conductor is provided.

However, in the structure disclosed in International Publication No. 2014/002592, in a case in which an interposer with a large thickness (a thickness in the stacking direction of the plurality of insulating base material layers) is required, the following problems may occur.

(a) It is difficult to provide an interlayer connection conductor having an elongated shape in the thickness direction using, for example, a plating method.

(b) In a case of a stacked body including a large number of stacked insulating base material layers, an interlayer connection conductor having an elongated shape in the thickness direction may be provided by connecting a plurality of via conductors (a via conductor provided, for example, by filling conductive paste in an opening provided in an insulating base material layer and solidifying the conductive paste by a thermal pressing process) to each other. However, in such a case, as the number of via conductors that are required is increased and the number of connection points of the via conductors is increased, reliability of electrical connection is reduced.

SUMMARY OF THE INVENTION

Preferred embodiments of the present invention provide interposers each having high reliability of electrical connection of wiring between a first element and a second element with a simple configuration, even when a thickness (a distance between the first element and the second element) is large, and electronic devices each including an interposer.

An interposer according to a preferred embodiment of the present invention is disposed between a first element and a second element and electrically connects the first element and the second element, and the interposer includes a stacked body including a plurality of insulating base material layers that are stacked on one another, being partially bent, and including a first mounting surface and a second mounting surface that face each other, a plurality of conductor patterns provided in the stacked body and extending in a first direction perpendicular or substantially perpendicular to the first mounting surface and the second mounting surface, an interlayer connection conductor provided in the stacked body, extending in a second direction parallel or substantially parallel to the first mounting surface and the second mounting surface, and connecting the plurality of conductor patterns, a first electrode provided on the first mounting surface, and a second electrode provided on the second mounting surface and electrically connected to the first electrode through the plurality of conductor patterns and the interlayer connection conductor, and the first mounting surface and the second mounting surface are parallel or substantially parallel to a stacking direction in which the plurality of insulating base material layers are stacked, and a length between the first mounting surface and the second mounting surface in the first direction is larger than a total length of the interlayer connection conductor in the second direction.

An interposer according to a preferred embodiment of the present invention is disposed between a first element and a second element and electrically connects the first element and the second element, and the interposer includes a stacked body including a plurality of insulating base material layers that are stacked on one another, being held while being partially bent, and including a first mounting surface and a second mounting surface that are parallel or substantially parallel to each other, a plurality of conductor patterns provided in the stacked body, an interlayer connection conductor provided in the stacked body, a first electrode provided on the first mounting surface, and a second electrode provided on the second mounting surface and electrically connected to the first electrode through the plurality of conductor patterns and the interlayer connection conductor, and the stacked body includes an upright portion in which a stacking direction in which the plurality of insulating base material layers are stacked is parallel or substantially parallel to the first mounting surface and the second mounting surface, in the upright portion, the plurality of conductor patterns extend in a first direction perpendicular or substantially perpendicular to the first mounting surface and the second mounting surface, in the upright portion, the interlayer connection conductor extends in a second direction parallel or substantially parallel to the first mounting surface and the second mounting surface, and connects the plurality of conductor patterns, and, in the upright portion, a length in the first direction is larger than a total length of the interlayer connection conductor in the second direction.

In this configuration, the wiring extending in the relatively long first direction (a direction in which the first element and the second element are spaced from each other)

is provided by the conductor patterns. Therefore, as compared with a case in which long wiring extending in the first direction is provided by the interlayer connection conductor, an interposer having high reliability of electrical connection of wiring to connect the first electrode and the second electrode is able to be easily achieved.

In an interposer according to a preferred embodiment of the present invention, either one of the first mounting surface and the second mounting surface may be an end surface of the stacked body parallel or substantially parallel to the stacking direction.

In an interposer according to a preferred embodiment of the present invention, the plurality of conductor patterns and the interlayer connection conductor are preferably bonded by solid state diffusion bonding. With this configuration, as compared with a case in which the interlayer connection conductor to be connected to the plurality of conductor patterns is formed by the plating method or any other suitable method, by a simple manufacturing method, bonding strength between the conductor patterns and the interlayer connection conductor is able to be increased.

In an interposer according to a preferred embodiment of the present invention, the interlayer connection conductor is preferably metal provided by plating. According to this configuration, as compared with a case in which the interlayer connection conductor is a via conductor provided by solidifying conductive paste, the conductor loss of the wiring (a signal line) to connect the first electrode and the second electrode is able to be further reduced.

In an interposer according to a preferred embodiment of the present invention, the plurality of insulating base material layers are preferably made of a resin as a main material, and the interlayer connection conductor preferably includes a resin material. The via conductor provided by solidifying conductive paste generally includes a resin component, so that, as compared with a plated through hole being a single metal or the like, bonding strength with the insulating base material layer made of a resin as a main material is increased. Therefore, as compared with the case in which the interlayer connection conductor is provided by the plating, the bonding strength between the interlayer connection conductor and the insulating base material layer is increased. Accordingly, an interposer with high mechanical strength and high reliability of electrical connection is able to be achieved.

In an interposer according to a preferred embodiment of the present invention, the plurality of insulating base material layers are preferably made of a resin as a main material, the interlayer connection conductor preferably includes a plurality of interlayer connection conductors each of which is provided on a different insulating base material layer, and the plurality of interlayer connection conductors are preferably disposed so as not to overlap with each other, when viewed in the second direction. The stacked body obtained by stacking a plurality of insulating base material layers made of a resin as a main material is easy to deform by external force, impact, or the like. In a case in which a plurality of interlayer connection conductors are consecutively disposed in the stacked body, and the stacked body deforms, stress concentrates on the interlayer connection conductors, and the interlayer connection conductors are easily damaged. On the other hand, according to this configuration, the plurality of interlayer connection conductors are not consecutively disposed in the stacking direction, so that, in a case in which an external force, impact, or the like is applied to the stacked body, the stress applied to each of the interlayer connection conductors is distributed. Therefore, even when an external force or the like is applied to the stacked body, damage of the interlayer connection conductor, and the like is significantly reduced or prevented, and the reliability of connection of the interlayer connection conductor with respect to the external force is increased.

In an interposer according to a preferred embodiment of the present invention, the interposer may further include a planar conductor provided in the stacked body, and the plurality of conductor patterns may be at least partially overlapped with the planar conductor, when viewed in the second direction. According to this configuration, due to a shielding effect of the planar conductor, with respect to an article or the like positioned on at least one side in the second direction when viewed from the interposer, unnecessary radiation from a signal line (a plurality of conductor patterns or interlayer connection conductors) is able to be significantly reduced or prevented, and/or the effect of noise from the outside on the signal line is able to be significantly reduced or prevented. In addition, according to this configuration, in a case in which the stacking direction of the plurality of insulating base material layers of a stacked body are parallel or substantially parallel to the first direction (a direction in which the first element and the second element are spaced from each other), as compared with a configuration in which a plurality of interlayer connection conductors extending in the first direction are disposed around (on the side in the second direction with respect to the signal line) the signal line, the shielding performance with respect to the signal line is increased. Therefore, isolation between the signal line and the outside is able to be increased.

In an interposer according to a preferred embodiment of the present invention, the planar conductor preferably includes a plurality of planar conductors, and the plurality of planar conductors are preferably disposed so as to interpose the plurality of conductor patterns or the interlayer connection conductor in the second direction. According to this configuration, the shielding effect of the planar conductor is further increased with respect to opposite sides in the second direction of the signal line. Therefore, with respect to articles or the like positioned on opposite sides in the second direction when viewed from the interposer, unnecessary radiation from a signal line (a plurality of conductor patterns or interlayer connection conductors) is able to be significantly reduced or prevented, and/or the effect of noise from the outside on the signal line is able to be significantly reduced or prevented.

In an interposer according to a preferred embodiment of the present invention, the plurality of insulating base material layers are preferably made of a thermoplastic resin. According to this configuration, an interposer capable of being easily plastically deformed and maintaining (holding) a desired shape is able to be achieved. In addition, according to this configuration, it is easy to deform an interposer into a desired shape, so that, even when high dimensional accuracy of an interposer is required, an interposer that is easily connected to a first element or a second element is able to be achieved.

An electronic device according to a preferred embodiment of the present invention includes a first element, a second element, and an interposer disposed between the first element and the second element and electrically connecting the first element and the second element, and the interposer includes a stacked body including a plurality of insulating base material layers that are stacked on one another, being held while being partially bent, and including a first mounting surface and a second mounting surface that face each other, a plurality of conductor patterns provided in the stacked body and extending in a first direction perpendicular or substantially perpendicular to the first mounting surface and the second mounting surface, an interlayer connection conductor provided in the stacked body, extending in a second direction parallel or substantially parallel to the first mounting surface and the second mounting surface, and connecting the plurality of conductor patterns, a first electrode provided on the first mounting surface, and a second electrode provided on the second mounting surface and electrically connected to the first electrode through the plurality of conductor patterns and the interlayer connection conductor, and the first mounting surface and the second mounting surface are surfaces parallel or substantially parallel to a stacking direction in which the plurality of insulating base material layers are stacked, a length between the first mounting surface and the second mounting surface in the first direction is larger than a total length of the interlayer connection conductor in the second direction, the first electrode is electrically connected to the first element, and the second electrode is electrically connected to the second element.

An electronic device according to a preferred embodiment of the present invention includes a first element, a second element, and an interposer disposed between the first element and the second element and electrically connecting the first element and the second element, and the interposer includes a stacked body including a plurality of insulating base material layers that are stacked on one another, being held while being partially bent, and including a first mounting surface and a second mounting surface that are parallel or substantially parallel to each other, a plurality of conductor patterns provided in the stacked body, an interlayer connection conductor provided in the stacked body, a first electrode provided on the first mounting surface, and a second electrode provided on the second mounting surface and electrically connected to the first electrode through the plurality of conductor patterns and the interlayer connection conductor, and the stacked body includes an upright portion in which a stacking direction in which the plurality of insulating base material layers are stacked is parallel or substantially parallel to the first mounting surface and the second mounting surface, in the upright portion, the plurality of conductor patterns extend in a first direction perpendicular or substantially perpendicular to the first mounting surface and the second mounting surface, in the upright portion, the interlayer connection conductor extends in a second direction parallel or substantially parallel to the first mounting surface and the second mounting surface, and connects the plurality of conductor patterns, in the upright portion, a length in the first direction is larger than a total length of the interlayer connection conductor in the second direction, the first electrode is electrically connected to the first element, and the second electrode is electrically connected to the second element.

According to this configuration, even when a thickness (a distance between the first element and the second element) is large, an electronic device having high reliability of electrical connection of the wiring between the first element and the second element is able to be achieved.

In an electronic device according to a preferred embodiment of the present invention, the stacked body preferably has a smaller effective elastic modulus than the first element and the second element. According to this configuration, the interposer has higher flexibility than the first element and the second element, and damage of a bonding portion due to stress or the like applied to the first element or the second element is significantly reduced or prevented.

In an electronic device according to a preferred embodiment of the present invention, the electronic device may further include a component mounted on the first element or the second element and disposed between the first element and the second element.

In an electronic device according to a preferred embodiment of the present invention, the interposer preferably includes a planar conductor provided in the stacked body, and the planar conductor is preferably at least partially disposed between the plurality of conductor patterns and the component. According to this configuration, the shielding effect of the planar conductor with respect to the component is increased, so that unnecessary radiation from a signal line (a plurality of conductor patterns or interlayer connection conductors) to the component is able to be significantly reduced or prevented, and/or the effect of noise from the component on the signal line is able to be significantly reduced or prevented.

According to preferred embodiments of the present invention, even when a thickness (a distance between a first element and a second element) is large, interposers each having high reliability of electrical connection of the wiring between the first element and the second element are able to be achieved with a simple configuration. In addition, electronic devices each including an interposer are able to be achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
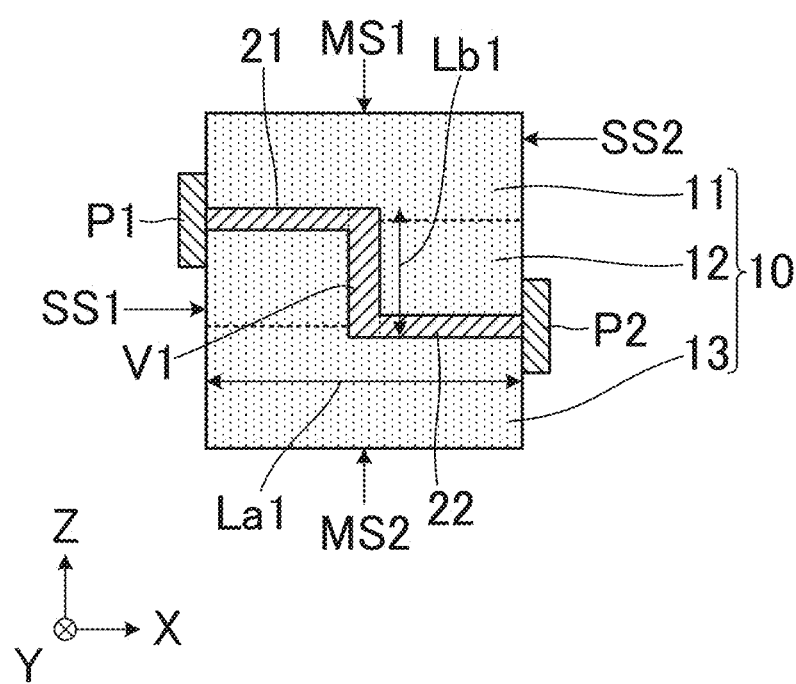
FIG. 1 is a cross-sectional view of an interposer 301 according to a first preferred embodiment of the present invention.

Hereinafter, preferred embodiments of the present invention will be described in detail with reference to the attached drawings and several specific examples. In the drawings, components and elements assigned with the same reference numerals or symbols will represent identical or substantially identical components and elements. While preferred embodiments of the present invention are divided and described for the sake of convenience in consideration of ease of description or understanding of main points, elements described in different preferred embodiments are able to be partially replaced and combined with each other. In the second and subsequent preferred embodiments, a description of matters common to the first preferred embodiment will be omitted and only different points will be described. In particular, the same advantageous functions and effects by the same configurations will not be described one by one for each preferred embodiment.

First Preferred Embodiment

FIG. 1 is a cross-sectional view of an interposer 301 according to a first preferred embodiment of the present invention.

Interposers according to preferred embodiments of the present invention are each disposed (interposed) between a first element and a second element, and electrically connect the first element and the second element. In addition, electronic devices according to preferred embodiments of the present invention are each a device mainly including an interposer according to a preferred embodiment of the present invention, and are each, for example, a portable telephone terminal, a smartphone, a tablet terminal, a notebook PC, a PDA, a wearable terminal (such as a so-called smartwatch and smart glasses), a camera, a game machine, a toy, or other suitable device.

The interposer 301 includes a stacked body 10, a plurality of conductor patterns 21 and 22, an interlayer connection conductor V1, a first electrode P1, and a second electrode P2.

The stacked body 10 is a rectangular or substantially rectangular parallelepiped shaped insulator including a plurality of flexible insulating base material layers 11, 12, and 13 that are stacked on one another. The stacked body 10 includes a first main surface MS1 and a second main surface MS2 that face each other. The first main surface MS1 and the second main surface MS2 are surfaces perpendicular or substantially perpendicular to a stacking direction (a Z axis direction) of the plurality of insulating base material layers 11, 12, and 13. In addition, the stacked body 10 includes an end surface SS1 and an end surface SS2 that face each other. The end surfaces SS1 and SS2 are surfaces (an end surface of the stacked body 10) parallel or substantially parallel to the stacking direction (the Z axis direction). The plurality of insulating base material layers 11, 12, and 13 are preferably sheets made of a thermoplastic resin, such as a liquid crystal polymer (LCP) or a polyether ether ketone (PEEK), for example.

In the first preferred embodiment, the end surface SS1 corresponds to the "first mounting surface", and the end surface SS2 corresponds to the "second mounting surface".

The plurality of conductor patterns 21 and 22 are provided in the stacked body 10 and extend in a first direction (an X axis direction shown in FIG. 1, for example) perpendicular or substantially perpendicular to the end surface SS1 (the first mounting surface) and the end surface SS2 (the second mounting surface). The plurality of conductor patterns 21 and 22 are preferably conductor patterns such as Cu foil, for example.

The interlayer connection conductor V1 is provided in the stacked body 10 and extends in a second direction (the Z axis direction shown in FIG. 1) parallel or substantially parallel to the end surface SS1 (the first mounting surface) and the end surface SS2 (the second mounting surface), and connects the plurality of conductor patterns 21 and 22. The interlayer connection conductor V1 is preferably made of metal (Cu, for example) formed by an electroless plating method, for example.

The first electrode P1 is provided on the end surface SS1 (the first mounting surface), and the second electrode P2 is provided on the end surface SS2 (the second mounting surface). The first electrode P1 and the second electrode P2 are electrically connected to each other through the plurality of conductor patterns 21 and 22 and the interlayer connection conductor V1. Specifically, the first electrode P1 is connected to one end of the conductor pattern 21. The other end of the conductor pattern 21 is connected to one end of the conductor pattern 22 through the interlayer connection conductor V1, and the other end of the conductor pattern 22 is connected to the second electrode P2. The first electrode P1 and the second electrode P2 are preferably plating films such as Cu films formed by electroless plating (or electroplating), for example.

In this manner, in the first preferred embodiment, the plurality of conductor patterns 21 and 22 and the interlayer connection conductor V1 that are electrically connected to each other provide wiring (a signal line) to connect the first electrode P1 and the second electrode P2.

In addition, as shown in FIG. 1, a length La1 between the end surface SS1 (the first mounting surface) and the end surface SS2 (the second mounting surface) in the X axis direction (the first direction) is larger than a total length Lb1 of the interlayer connection conductor V1 in the Z axis direction (the second direction) (La1>Lb1). In other words, in the wiring connecting the first electrode P1 and the second electrode P2, a length of wiring (an electrical path of the plurality of conductor patterns 21 and 22) extending in the first direction (the X axis direction) is larger than a length of wiring (the interlayer connection conductor V1) extending in the second direction (the Z axis direction).

Figure 2:
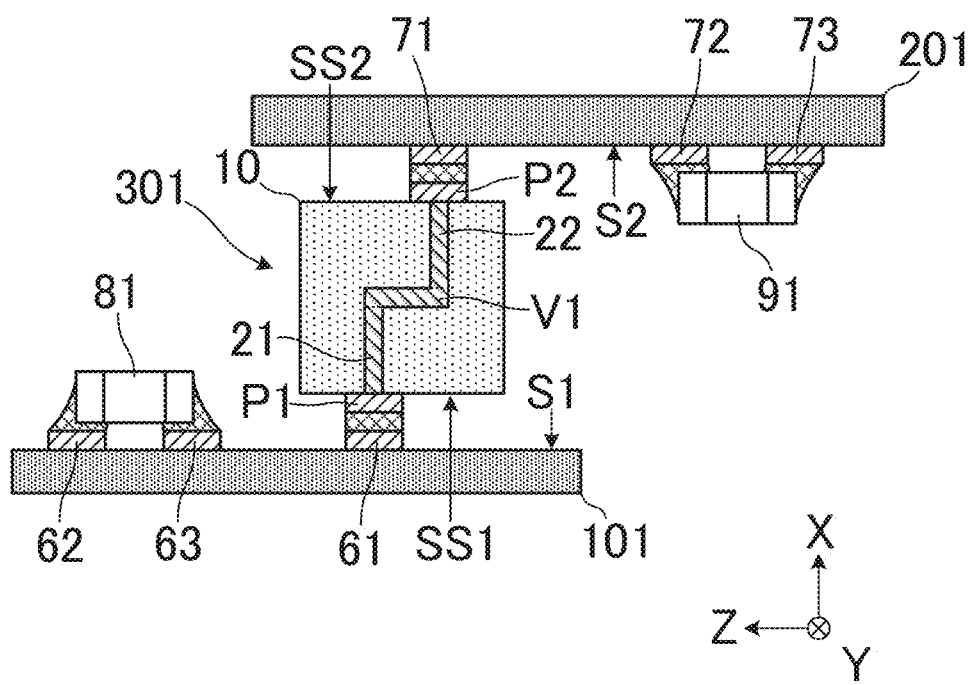
FIG. 2 is a cross-sectional view showing a main portion of an electronic device 401 according to the first preferred embodiment of the present invention.

Subsequently, an electronic device including the interposer 301 according to the present preferred embodiment will be described with reference to the drawings. FIG. 2 is a cross-sectional view showing a main portion of an electronic device 401 according to the first preferred embodiment.

The electronic device 401 includes a first circuit board 101, a second circuit board 201, an interposer 301, and components 81 and 91. The first circuit board 101 and the second circuit board 201 are disposed at a distance from each other in the first direction (the X axis direction), and the interposer 301 and the components 81 and 91 are disposed (interposed) between the first circuit board 101 and the second circuit board 201. The first circuit board 101 and the second circuit board 201 are preferably glass epoxy substrates, for example. The components 81 and 91 are preferably chip components such as chip inductors or chip capacitors, RFIC elements, or impedance matching circuits, for example.

In the first preferred embodiment, the first circuit board 101 corresponds to the "first element", and the second circuit board 201 corresponds to the "second element".

As shown in FIG. 2, the interposer 301 and the component 81 are mounted on an upper surface S1 of the first circuit board 101. The component 91 is mounted on a lower surface S2 of the second circuit board 201. The interposer 301 is connected to both the first circuit board 101 and the second circuit board 201 in an upright state (a state in which the end surface SS1 (the first mounting surface) of the stacked body 10 faces the first circuit board 101, and the end surface SS2 (the second mounting surface) of the stacked body 10 faces the lower surface S2 of the second circuit board 201).

A plurality of lands 61, 62, and 63 are mounted on the upper surface S1 of the first circuit board 101. The first electrode P1 of the interposer 301 is directly soldered to the land 61. As a result, the first electrode P1 of the interposer 301 is electrically connected to the first circuit board 101 (the first element). In addition, terminals of the component 81 are directly soldered to the lands 62 and 63, respectively.

A plurality of lands 71, 72, and 73 are provided on the lower surface S2 of the second circuit board 201. The second electrode P2 of the interposer 301 is directly soldered to the land 71. As a result, the second electrode P2 of the interposer 301 is electrically connected to the second circuit board 201 (the second element). In addition, terminals of the component 91 are directly soldered to the lands 72 and 73, respectively.

In the first preferred embodiment, an effective elastic modulus of the interposer 301 is smaller than an effective elastic modulus of the first circuit board 101 and the second circuit board 201. For example, a Young's modulus of the glass epoxy substrate is preferably about 25 GPa. On the other hand, a Young's modulus of the liquid crystal polymer (LCP) of the stacked body 10 of the interposer 301 is preferably about 15 GPa, for example.

It is to be noted that the "effective elastic modulus" in the present specification is not limited to an "elastic modulus" of a single material and may refer to an "elastic modulus" of the entire composite material (for example, a composite material including resin, a conductor pattern, an interlayer connection conductor, or an adhesive agent).

According to the interposer 301 and the electronic device 401 of the first preferred embodiment, the following advantageous effects are obtained.

(a) In the first preferred embodiment, in the wiring between the first electrode P1 and the second electrode P2, wiring extending in the relatively long first direction (the X axis direction, a direction in which the first element and the second element are spaced from each other) is provided by the conductor patterns 21 and 22. In a case of a common interposer (an interposer including a stacked body including a plurality of insulating base material layers that are stacked in the first direction), the wiring extending in the first direction is provided by an interlayer connection conductor such as a plated through hole or a via conductor (a via conductor made of solidified conductive paste). In particular, in a case in which long wiring extending in the first direction is provided by a plated through hole, it is necessary to provide an elongated through hole, and it is difficult to provide a through hole or perform plating processing. In addition, in a case in which the long wiring extending in the first direction is provided by a via conductor, processes such as providing an opening in each of the plurality of insulating base material layers and filling the opening with conductive paste and the like are required, so that a manufacturing process becomes complicated. According to the above described configuration, with a simple configuration, as compared with a case in which the long wiring extending in the first direction is provided by the interlayer connection conductor (such as a plated through hole or a via conductor), an interposer having high reliability of electrical connection of a signal line (wiring to connect the first electrode P1 and the second electrode P2) is able to be achieved.

(b) In addition, as described above, in the first preferred embodiment, the long wiring extending in the first direction of the signal line (the wiring to connect the first electrode P1 and the second electrode P2) is provided by the conductor patterns 21 and 22. In general, the volume resistivity of a via conductor provided by solidifying conductive paste is higher than the volume resistivity of a conductor pattern (a metal simple substance). Therefore, as with the common interposer, when all of the long wiring extending in the first direction is provided by a via conductor, conductor loss is increased. On the other hand, a line width of the conductor pattern is able to be easily adjusted, so that a larger line width of the conductor pattern is able to easily reduce the conductor loss. Accordingly, with the above described configuration, as compared with a case which the long wiring extending in the first direction is provided by the via conductor, the conductor loss of the signal line is able to be easily reduced.

(c) In addition, in the first preferred embodiment, the interlayer connection conductor V1 is a plated through hole. According to this configuration, as compared with a case in which the interlayer connection conductor is a via conductor provided by solidifying conductive paste, the conductor loss of the signal line (the wiring to connect the first electrode P1 and the second electrode P2) is able to be further reduced.

(d) In the first preferred embodiment, the interposer 301 is interposed between the first element (the first circuit board 101) and the second element (the second circuit board 201), and the first element and the second element are electrically connected to each other through the interposer 301. According to this configuration, while a space to mount the components 81 and 91 on the surface (the upper surface S1 of the first circuit board 101) of the first element, and the surface (the lower surface S2 of the second circuit board 201) of the second element is ensured, the first circuit board 101 and the second circuit board 201 are able to be electrically connected at a distance from each other.

(e) In addition, in the electronic device according to the first preferred embodiment, the first electrode P1 of the interposer 301 is directly soldered to the land 61 of the first circuit board 101, and the second electrode P2 of the interposer 301 is directly soldered to the land 71 of the second circuit board 201. According to this configuration, the interposer 301 and the first circuit board 101 are able to be bonded with almost no unnecessary gap, so that the interposer 301 is able to be disposed even in a small space in the electronic device. In addition, since almost no unnecessary gap exists between the interposer 301 and the first circuit board 101, the unnecessary radiation and energy loss due to leakage of electromagnetic waves are significantly reduced or prevented. Further, according to this configuration, as compared with a case in which the interposer is connected to the first circuit board through a connector, impedance mismatching hardly occurs and a return loss is also significantly reduced or prevented. It is to be noted that the same applies to connection between the interposer 301 and the second circuit board 201.

(f) The interposer 301 (the stacked body 10) according to the first preferred embodiment has a smaller effective elastic modulus than the first circuit board 101 (the first element) and the second circuit board 201 (the second element), and has flexibility (deformability). According to this configuration, for example, an interposer is able to be mounted in a place even with slight irregularities of the first element (or the second element). In addition, the interposer 301 has higher flexibility than the first circuit board 101 or the second circuit board 201, so that damage to a bonding portion (a bonding portion between the first electrode P1 and the land 61, a bonding portion between the second electrode P2 and the land 71) due to stress or the like applied to the first circuit board 101 or the second circuit board 201 is significantly reduced or prevented.

It is to be noted that, in the first preferred embodiment, the plurality of insulating base material layers 11, 12, and 13 that define the stacked body 10 are preferably made of a thermoplastic resin, for example. According to this configuration, an interposer capable of being easily plastically deformed and maintaining (holding) a desired shape is able to be achieved. It is to be noted that, in a case in which an interposer is directly connected with solder to the first element and the second element that are less easily deformed, high dimensional accuracy is required for the interposer. On the other hand, according to the above described configuration, the stacked body 10 including a plurality of sheets made of a thermoplastic resin that are stacked on one another is used, so that an interposer has flexibility (deformability), which makes it easier to change an interposer into a desired shape. Therefore, in particular, even when high dimensional accuracy is required for such an interposer, deforming the interposer before connection makes it easy to connect the first element or the second element and the interposer.

It is to be noted that, in a case of a common interposer (an interposer including a stacked body obtained by stacking a plurality of insulating base material layers in a first direction), the thickness (a thickness dimension) in the first direction is difficult to be accurately maintained. For example, when a plurality of stacked insulating base material layers are thermally pressed to provide a stacked body, there is a possibility that the amount of sinking of an electrode to the stacked body may vary, and the thickness of the interposer in the first direction may vary. In addition, a conductor pattern provided on the stacked body may generate irregularities on a main surface (a surface on which an electrode is provided) of the stacked body. Further, when a protective film, such as a solder resist film, for example, is provided on the main surface of the thermally pressed stacked body, there is also a possibility that the thickness may vary due to a wet condition or viscosity of the protective film. On the other hand, in the electronic device 401 according to the first preferred embodiment, the interposer 301 is connected to the first element and the second element in an upright state (a state in which the end surface SS1 of the stacked body 10 faces the first element, and the end surface SS2 of the stacked body 10 faces the second element), so that the thickness dimension in the first direction is easy to accurately maintain. This is because, as will be described in detail later, the interposer 301 is obtained by cutting out an individual piece from a collective substrate. In other words, the thickness (the thickness dimension in the first direction) of the interposer 301 is fixed by cutting accuracy, and is not affected by variations in the thickness dimension due to the irregularities provided on the main surface of the stacked body, the wet condition of the protective film, or the like.

Figure 3:
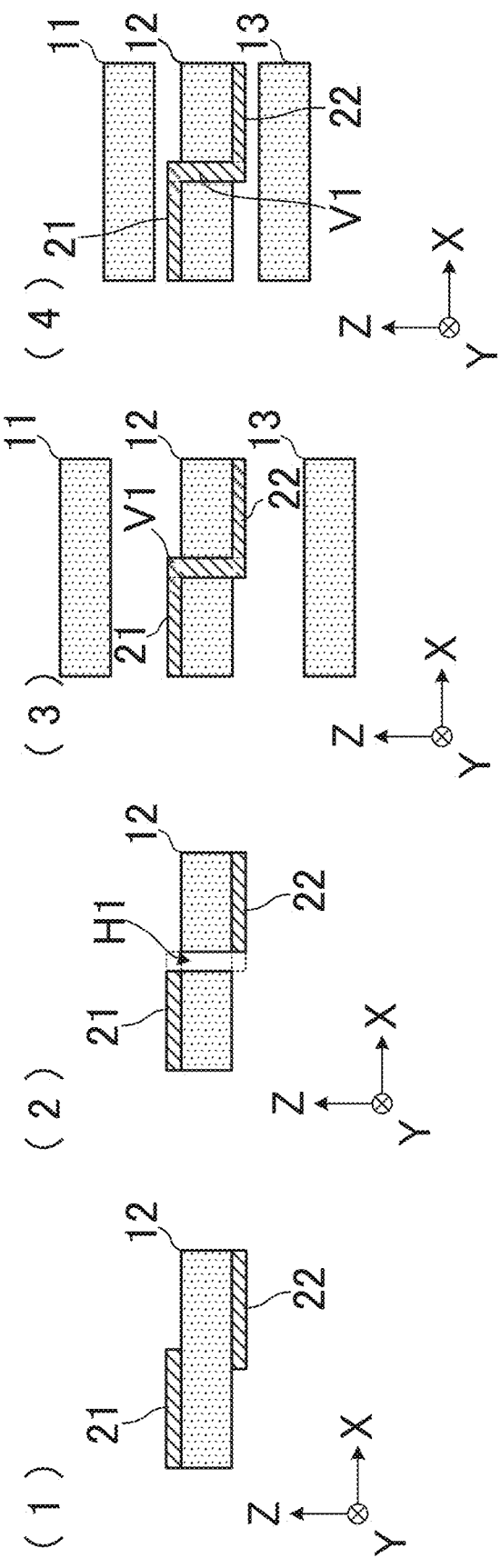
FIG. 3 is a cross-sectional view sequentially showing a process of manufacturing the interposer 301.
Figure 3:
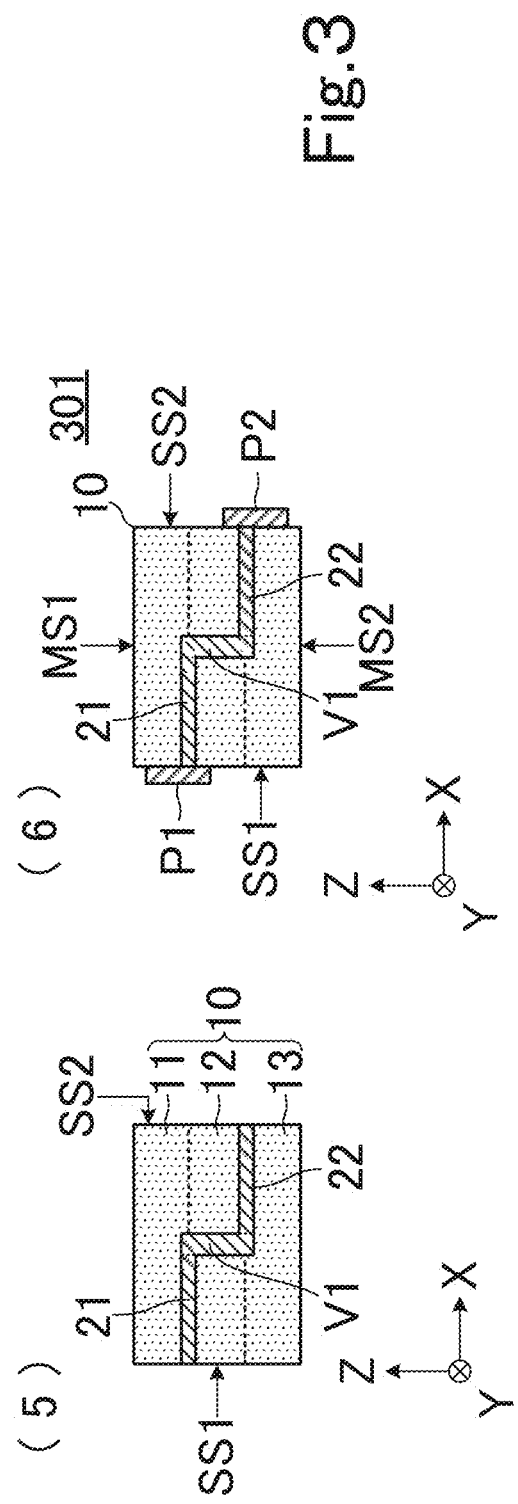

The interposer 301 according to the first preferred embodiment can be manufactured by, for example, the following process. FIG. 3 is a cross-sectional view sequentially showing a non-limiting example of a process of manufacturing the interposer 301. It is to be noted that, in FIG. 3, for the sake of convenience of explanation, although explanation will be provided in a manufacturing process for one chip (an individual piece), the actual process of manufacturing an interposer is performed in the state of a collective substrate.

First, as shown in (1) in FIG. 3, the insulating base material layer 12 of which both sides include the conductor patterns 21 and 22 is prepared. Specifically, metal foil (Cu foil, for example) is laminated on both sides of the insulating base material layer 12 in a collective substrate state, and then the metal foil is patterned by photolithography, for example. The insulating base material layer 12 is a sheet mainly made of a thermoplastic resin, such as a liquid crystal polymer (LCP) or a polyether ether ketone (PEEK), for example.

Subsequently, as shown in (2) in FIG. 3, an opening H1 is provided in the insulating base material layer 12. The opening H1 is a through hole that extends from a front surface of the insulating base material layer 12 to a back surface. The opening H1 is formed by die-cutting such as punching, for example.

Subsequently, as shown in (3) in FIG. 3, the interlayer connection conductor V1 is provided in the insulating base material layer 12, and the insulating base material layers 11 and 13 are prepared. The interlayer connection conductor V1 is made of metal (a plated through hole such as Cu, for example) formed by electroless plating, for example. The plane shape of the insulating base material layers 11 and 13 is the same or substantially the same as the plane shape of the insulating base material layer 12. The insulating base material layers 11 and 13 are sheets mainly made of a thermoplastic resin such as a liquid crystal polymer (LCP) or a polyether ether ketone (PEEK), for example.

Subsequently, as shown in (4) in FIG. 3, the insulating base material layers 13, 12, and 11 are stacked in order. Subsequently, the stacked body 10 in a collective substrate state as shown in (5) in FIG. 3 is provided by thermally pressing the stacked insulating base material layers 11, 12, and 13, and then a collective substrate is divided to an individual piece.

Finally, the first electrode P1 and the second electrode P2 are provided on the end surfaces SS1 and SS2 of the stacked body 10, respectively, to obtain the interposer 301 shown in (6) in FIG. 3. The first electrode P1 and the second electrodes P2 are plating films such as Cu films formed by electroless plating (or electroplating), for example.

Second Preferred Embodiment

A second preferred embodiment of the present invention provides an example of an interposer including an interlayer connection conductor having a different configuration.

Figure 4:
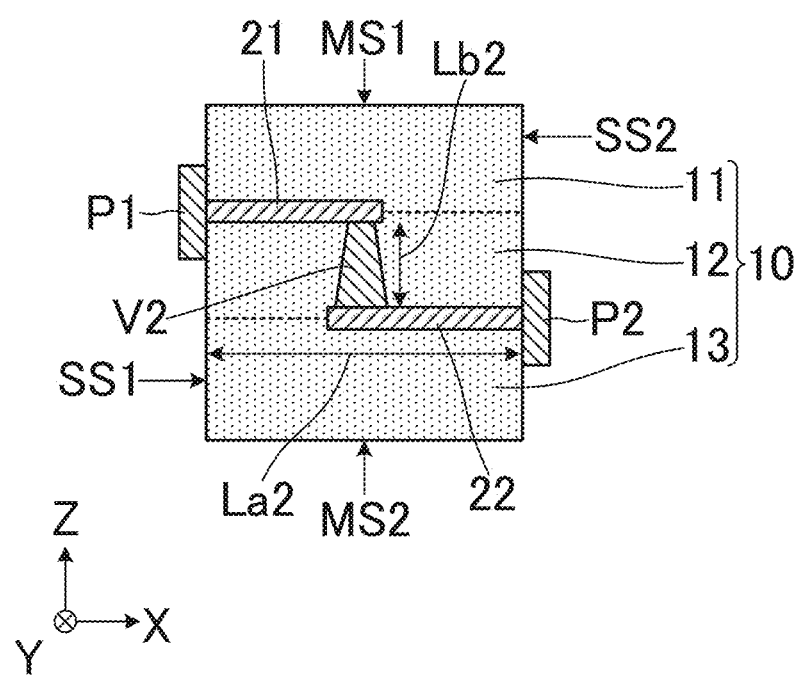
FIG. 4 is a cross-sectional view of an interposer 302 according to a second preferred embodiment of the present invention.

FIG. 4 is a cross-sectional view of an interposer 302 according to the second preferred embodiment of the present invention.

The interposer 302 is different from the interposer 301 according to the first preferred embodiment in terms of including an interlayer connection conductor V2. Other configurations of the interposer 302 are the same or substantially the same as the configurations of the interposer 301.

Hereinafter, the differences from the interposer 301 according to the first preferred embodiment will be described.

The interlayer connection conductor V2 is provided in the stacked body 10 and extends in a second direction (the Z axis direction shown in FIG. 4) parallel or substantially parallel to the end surface SS1 (the first mounting surface) and the end surface SS2 (the second mounting surface), and connects the plurality of conductor patterns 21 and 22. The interlayer connection conductor V2 is a via conductor provided, for example, by forming an opening in the insulating base material layer 12, forming the opening with conductive paste including one or more of Cu and Sn or an alloy including one or more of Cu and Sn, for example, and then solidifying the conductive paste through the subsequent thermal pressing in a stacking process.

As shown in FIG. 4, a length La2 between the end surface SS1 (the first mounting surface) and the end surface SS2 (the second mounting surface) in the X axis direction (the first direction) is larger than a total length Lb2 of the interlayer connection conductor V2 in the Z axis direction (the second direction) (La2>Lb2).

According to the interposer 302 of the second preferred embodiment of the present invention, the following advantageous effects in addition to the advantageous effects described in the first preferred embodiment are obtained.

(g) In the second preferred embodiment, the plurality of conductor patterns 21 and 22 and the interlayer connection conductor V2 are bonded by solid state diffusion bonding. With this configuration, as compared with a case in which the interlayer connection conductor to be connected to the plurality of conductor patterns 21 and 22 is formed by the plating method or any other suitable method, by a simple manufacturing method, bonding strength between the conductor patterns and the interlayer connection conductor is able to be increased.

(h) In addition, in the second preferred embodiment, the interlayer connection conductor V2 preferably includes a resin material. The via conductor (the interlayer connection conductor V2) provided by solidifying conductive paste includes a resin component, so that, as compared with a plated through hole being a single metal, bonding strength with the insulating base material layer made of a resin as a main material is increased. Therefore, as compared with the case in which the interlayer connection conductor is provided by the plating, the bonding strength between the interlayer connection conductor V2 and the insulating base material layer 12 is increased. Accordingly, with this configuration, an interposer with high mechanical strength and high reliability of electrical connection is able to be achieved.

(i) Further, in the second preferred embodiment, the plurality of insulating base material layers 11, 12, and 13 that define the stacked body 10 are preferably made of a thermoplastic resin, for example, and the interlayer connection conductor V2 is a via conductor provided by solidifying conductive paste. According to this configuration, as will be described in detail later, since the stacked body 10 is able to be easily provided by collectively pressing the stacked insulating base material layers 11, 12, and 13, the number of manufacturing steps of the stacked body 10 and the cost are able to be reduced.

Figure 5:
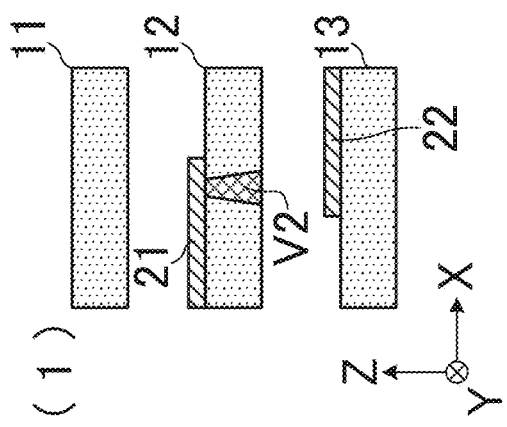
FIG. 5 is a cross-sectional view sequentially showing a process of manufacturing the interposer 302.
Figure 5:
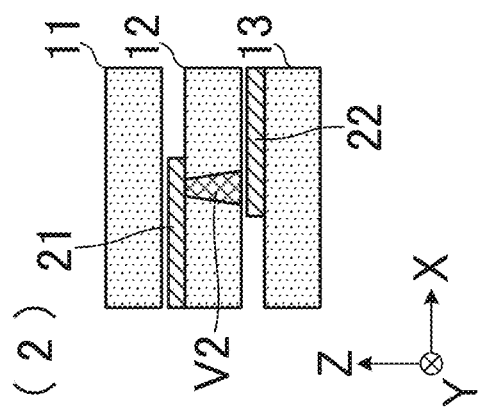
Figure 5:
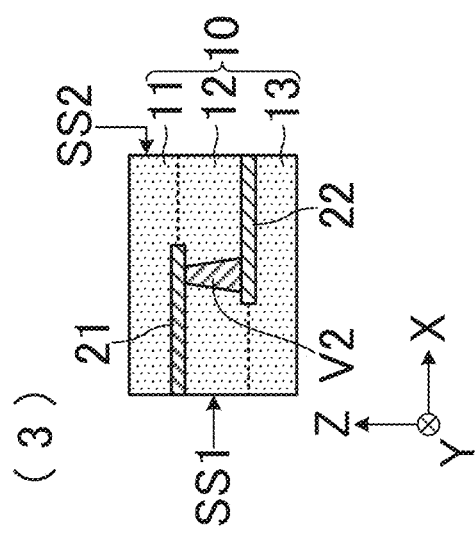
Figure 5:
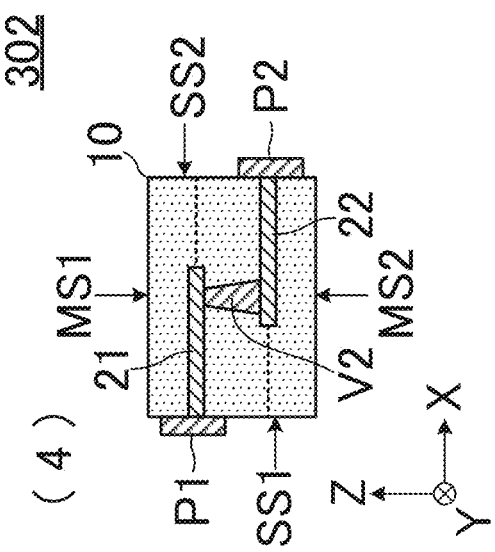

The interposer 302 according to the second preferred embodiment may be manufactured by, for example, the following process. FIG. 5 is a cross-sectional view sequentially showing a non-limiting example of a process of manufacturing the interposer 302.

First, as shown in (1) in FIG. 5, the insulating base material layers 11, 12, and 13 are prepared. In addition, a conductor pattern 21 is provided on the insulating base material layer 12, and a conductor pattern 22 is provided on the insulating base material layer 13. Specifically, metal foil (Cu foil, for example) is laminated on one side of the insulating base material layers 12 and 13 in a collective substrate state, and then the metal foil is patterned by photolithography.

In addition, an interlayer connection conductor V2 is provided on the insulating base material layer 12. The interlayer connection conductor V2 is provided by forming an opening in the insulating base material layer 12 by a laser or the like, then providing (filling) conductive paste including one or more of Cu, Sn, and the like, or an alloy including one or more of Cu, Sn, and the like, for example, and then solidifying the conductive paste through the thermal pressing in the stacking process. Therefore, the interlayer connection conductor V2 is preferably made of a material having a melting point (a melting temperature) lower than the temperature at the time of the subsequent thermal pressing.

Subsequently, as shown in (2) in FIG. 5, the insulating base material layers 13, 12, and 11 are stacked in order. Subsequently, the stacked body 10 in a collective substrate state as shown in (3) in FIG. 5 is provided by thermally pressing the stacked insulating base material layers 11, 12, and 13, and then a collective substrate is divided to an individual piece.

Finally, the first electrode P1 and the second electrode P2 are provided on the end surfaces SS1 and SS2 of the stacked body 10, respectively, to obtain the interposer 302 shown in (6) in FIG. 5.

According to the above manufacturing method, since the interposer 302 (the stacked body 10) is able to be easily provided by collectively pressing the stacked insulating base material layers 11, 12, and 13, the number of manufacturing steps and the cost are able to be reduced.

Third Preferred Embodiment

A third preferred embodiment of the present invention provides an example of an interposer including a plurality of interlayer connection conductors and a planar conductor.

Figure 6:
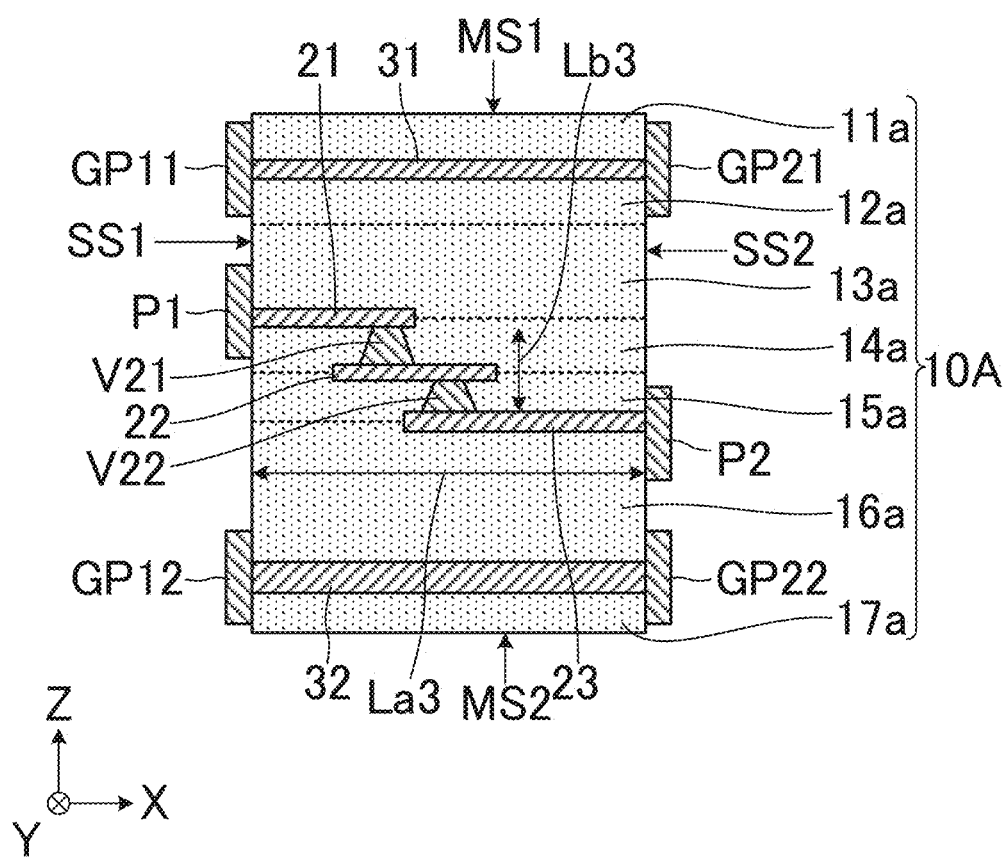
FIG. 6 is a cross-sectional view of an interposer 303 according to a third preferred embodiment of the present invention.
Figure 7:
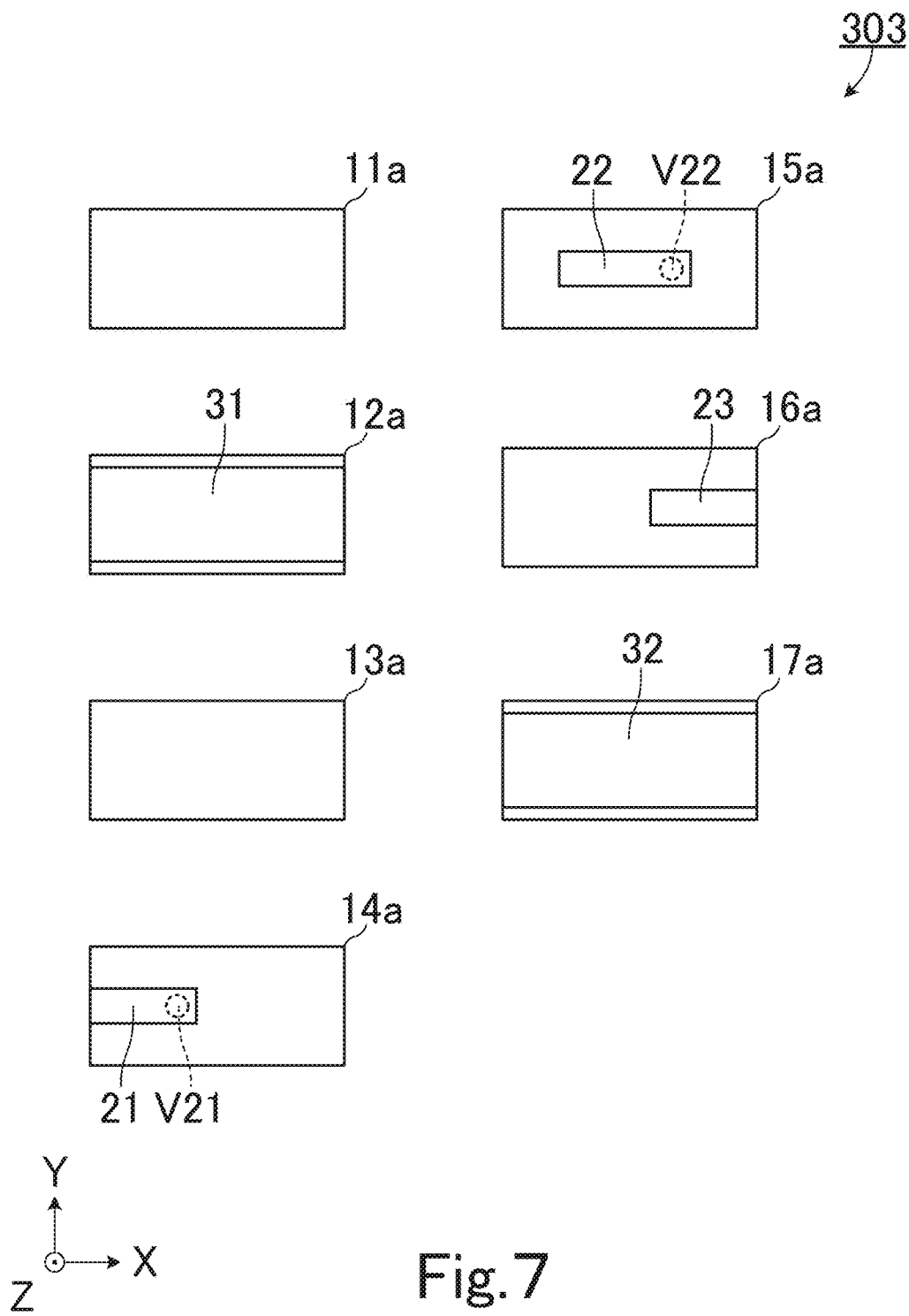
FIG. 7 is an exploded plan view of the interposer 303.

FIG. 6 is a cross-sectional view of an interposer 303 according to the third preferred embodiment of the present invention. FIG. 7 is an exploded plan view of the interposer 303.

The interposer 303 includes a stacked body 10A, a plurality of conductor patterns 21, 22, and 23, planar conductors 31 and 32, interlayer connection conductors V21 and V22, a first electrode P1, a second electrode P2, and ground electrodes GP11, GP12, GP21, and GP22.

The interposer 303 is different from the interposer 302 according to the second preferred embodiment in terms of including the stacked body 10A, the planar conductors 31 and 32, the ground electrodes GP11, GP12, GP21, and GP22. In addition, the interposer 303 is different from the interposer 302 in the number of conductor patterns and the number of interlayer connection conductors. Other configurations of the interposer 303 are the same or substantially the same as the configurations of the interposer 302.

Hereinafter, the differences from the interposer 302 according to the second preferred embodiment will be described.

The stacked body 10A is a rectangular or substantially rectangular parallelepiped shaped insulator including a plurality of flexible insulating base material layers 11a, 12a, 13a, 14a, 15a, 16a, and 17a that are stacked on one another. The stacked body 10A includes an end surface SS1 (a first mounting surface) and an end surface SS2 (a second mounting surface) that face each other. The end surface SS1 is (an end surface of the stacked body 10A) parallel or substantially parallel to the stacking direction (the Z axis direction) of the plurality of insulating base material layers 11a to 17a. The insulating base material layers 11a to 17a are the same or substantially the same as the insulating base material layers 11, 12, and 13 described in the first preferred embodiment.

The plurality of conductor patterns 21, 22, and 23 are provided in the stacked body 10A and extend in a first direction (an X axis direction shown in FIG. 6, for example) perpendicular or substantially perpendicular to the end surface SS1 (the first mounting surface) and the end surface SS2 (the second mounting surface). The planar conductors 31 and 32 are conductor patterns provided in the stacked body 10A and extend in the first direction. The plurality of conductor patterns 21, 22, and 23 and the planar conductors 31 and 32 are preferably made of, for example, Cu foil or similar foil.

The interlayer connection conductors V21 and V22 are provided in the stacked body 10A and extend in a second direction (the Z axis direction shown in FIG. 6) parallel or substantially parallel to the end surface SS1 (the first mounting surface) and the end surface SS2 (the second mounting surface), and connect the plurality of conductor patterns 21, 22, and 23. The interlayer connection conductors V21 and V22 are preferably, for example, via conductors provided by forming an opening in the insulating base material layer with a laser or any other suitable method, then providing (filling) the opening with conductive paste including one or more of Cu, Sn, and the like or an alloy including one or more of Cu, Sn, and the like, and then solidifying the conductive paste through the subsequent thermal pressing in the stacking process.

As shown in FIG. 6 and FIG. 7, each of the interlayer connection conductors V21 and V22 is provided on a different insulating base material layer. Specifically, the interlayer connection conductor V21 is provided in the insulating base material layer 14a, and the interlayer connection conductor V22 is provided in the insulating base material layer 15a. The plurality of interlayer connection conductors V21 and V22 do not overlap with each other, when viewed in the second direction (the Z axis direction).

The first electrode P1 and the ground electrodes GP11 and GP12 are provided on the end surface SS1 (the first mounting surface), and the second electrode P2 and the ground electrodes GP21 and GP22 are provided on the end surface SS2 (the second mounting surface). The ground electrodes GP11, GP12, GP21, and GP22 are preferably plating films such as Cu films formed by electroless plating (or electroplating), for example.

The first electrode P1 and the second electrode P2 are electrically connected to each other through the plurality of conductor patterns 21, 22, and 23 and the interlayer connection conductors V21 and V22. Specifically, as shown in FIG. 6 and FIG. 7, the first electrode P1 is connected to one end of the conductor pattern 21, and the other end of the conductor pattern 21 is connected to one end of the conductor pattern 22 through the interlayer connection conductor V21. The other end of the conductor pattern 22 is connected to one end of the conductor pattern 23 through the interlayer connection conductor V22, and the other end of the conductor pattern 23 is connected to the second electrode P2. In addition, the ground electrode GP11 and the ground electrode GP21 are electrically connected to each other through the planar conductor 31. The ground electrode GP12 and the ground electrode GP22 are electrically connected to each other through the planar conductor 32.

In this manner, in the second preferred embodiment, the plurality of conductor patterns 21, 22, and 23 and the interlayer connection conductors V21 and V22 that are electrically connected to each other provide wiring (a signal line) to connect the first electrode P1 and the second electrode P2.

In the second preferred embodiment, the conductor pattern 21, the planar conductors 31 and 32, the insulating base material layers 12a and 13a interposed between the conductor pattern 21 and the planar conductor 31, and the insulating base material layers 14a, 15a, and 16a interposed between the conductor pattern 21 and the planar conductor 32 define a transmission line of a stripline structure. In addition, the conductor pattern 23, the planar conductors 31 and 32, the insulating base material layers 12a, 13a, 14a, and 15a interposed between the conductor pattern 23 and the planar conductor 31, and the insulating base material layer 16a interposed between the conductor pattern 23 and the planar conductor 32 define a transmission line of a stripline structure.

As shown in FIG. 6, a length La3 between the end surface SS1 (the first mounting surface) and the end surface SS2 (the second mounting surface) in the X axis direction (the first direction) is larger than a total length Lb3 of the interlayer connection conductors V21 and V22 in the Z axis direction (the second direction) (La3>Lb3).

The plurality of conductor patterns 21, 22, and 23 entirely or substantially entirely overlap with the planar conductors 31 and 32, when viewed in the second direction (the Z axis direction). In addition, the planar conductors 31 and 32 are disposed at positions to interpose the plurality of conductor patterns 21, 22, and 23 or the interlayer connection conductors V21 and V22 in the second direction (the Z axis direction).

Figure 8:
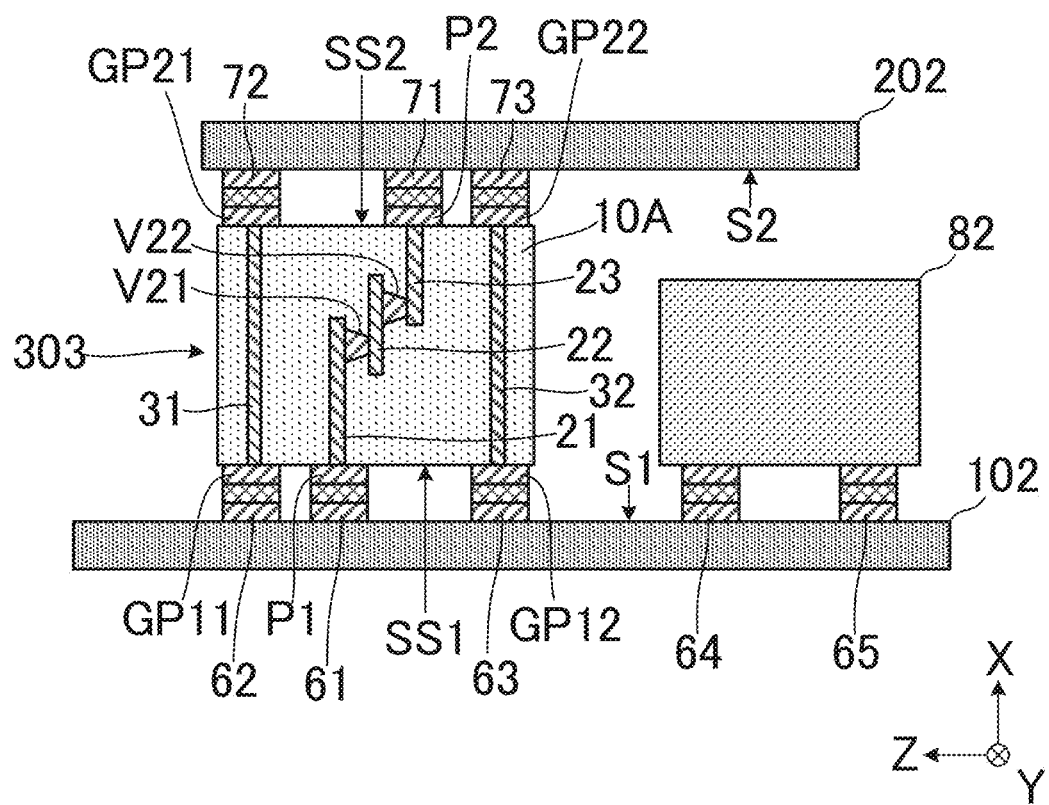
FIG. 8 is a cross-sectional view showing a main portion of an electronic device 403 according to the third preferred embodiment of the present invention.

Subsequently, an electronic device including the interposer 303 will be described with reference to the drawings. FIG. 8 is a cross-sectional view showing a main portion of an electronic device 403 according to the third preferred embodiment of the present invention.

The electronic device 403 includes a first circuit board 102 (a first element), a second circuit board 202 (a second element), an interposer 303, and a component 82. It is to be noted that a large number of components in addition to the component 82 are disposed on the first circuit board 102 and the second circuit board 202 but are omitted from the illustration. The first circuit board 102 and the second circuit board 202 are disposed at a distance from each other in the first direction (the X axis direction), and the interposer 303 and the component 82 are disposed between the first circuit board 102 and the second circuit board 202. The configuration of the first circuit board 102 is the same or substantially the same as the configuration of the first circuit board 101 described in the first preferred embodiment. The configuration of the second circuit board 202 is the same or substantially the same as the configuration of the second circuit board 201 described in the first preferred embodiment. In addition, the component 82 includes a chip capacitor that defines an impedance matching circuit, for example. It is to be noted that a different component may be disposed in proximity on the opposite side (the side in the positive Z direction of the interposer 303) of the component 82 with the interposer 303 interposed between the components.

As shown in FIG. 8, the interposer 303 and the component 82 are mounted on an upper surface S1 of the first circuit board 102. The end surface SS1 (the first mounting surface) of the stacked body 10A faces the first circuit board 102, and the end surface SS2 (the second mounting surface) of the stacked body 10A faces a lower surface S2 of the second circuit board 202.

A plurality of lands 61, 62, 63, 64, and 65 are provided on the upper surface S1 of the first circuit board 102. The first electrode P1 of the interposer 303 is directly soldered to the land 61. As a result, the first electrode P1 of the interposer 303 is electrically connected to the first circuit board 102 (the first element). In addition, the ground electrodes GP11 and GP12 of the interposer 303 are directly soldered to the lands, respectively. As a result, the ground electrodes GP11 and GP12 of the interposer 303 are electrically connected to a ground of the first circuit board 102. In addition, terminals of the component 82 are directly soldered to the lands 64 and 65, respectively.

A plurality of lands 71, 72, and 73 are provided on the lower surface S2 of the second circuit board 202. The second electrode P2 of the interposer 303 is directly soldered to the land 71. As a result, the second electrode P2 of the interposer 303 is electrically connected to the second circuit board 201 (the second element). In addition, the ground electrodes GP21 and GP22 of the interposer 303 are directly soldered to the lands 72 and 73, respectively. As a result, the ground electrodes GP21 and GP22 of the interposer 303 are electrically connected to a ground of the second circuit board 202.

As shown in FIG. 8, the planar conductor 32 is at least partially located between the plurality of conductor patterns 21, 22, and 23 and the component 82.

In addition, in the third preferred embodiment, the first circuit board 102 and the second circuit board 202 are preferably glass epoxy substrates, and have an effective relative dielectric constant of about 4, for example. On the other hand, the stacked body 10A of the interposer 303 is preferably made of a liquid crystal polymer (LCP), and has an effective relative dielectric constant of about 3, for example. In other words, in the third preferred embodiment, an effective relative dielectric constant of the stacked body 10A of the interposer 303 is smaller than an effective relative dielectric constant of the first circuit board 102 and the second circuit board 202.

It is to be noted that, the "effective relative dielectric constant" is not limited to a "relative dielectric constant" of a single material but may refer to a "relative dielectric constant" of the entire composite material (a composite material including resin, a conductor pattern, an interlayer connection conductor, or an adhesive agent).

According to the interposer 303 and the electronic device 403 of the third preferred embodiment of the present invention, the following advantageous effects in addition to the advantageous effects described in the second preferred embodiment are obtained.

(j) In general, the stacked body obtained by stacking a plurality of insulating base material layers made of a resin as a main material is easy to deform by external force, impact, or the like. In a case in which a plurality of interlayer connection conductors are consecutively disposed in the stacked body, and the stacked body deforms, stress concentrates on these interlayer connection conductors, and these interlayer connection conductors are easily damaged. In contrast, in the third preferred embodiment, the plurality of interlayer connection conductors V21 and V22 are disposed so as not to overlap with each other, when viewed in the second direction (the Z axis direction). According to this configuration, the plurality of interlayer connection conductors V21 and V22 are not consecutively disposed in the second direction, so that, in a case in which the external force (external force in the Z axis direction, in particular), impact, or the like is applied to the stacked body 10A, the stress applied to each of the interlayer connection conductors V21 and V22 is distributed. Therefore, even when the external force or the like is applied to the stacked body 10A, damage to the interlayer connection conductors V21 and V22, and the like is significantly reduced or prevented, and the reliability of connection of the interlayer connection conductors V21 and V22 with respect to the external force is increased. Accordingly, an interposer with high mechanical strength is able to be achieved.

(k) The interposer 303 according to the third preferred embodiment has a smaller effective relative dielectric constant than the first circuit board 102 (the first element) and the second circuit board 202 (the second element). As a result, a capacitance component to be generated between the conductor patterns (between the conductor pattern 21 and the planar conductor 32 or between the conductor pattern 23 and the planar conductor 31, for example) of the interposer 303 is able to be reduced. In general, a coefficient of linear expansion of the circuit board on which a component is mounted needs to be matched with a coefficient of linear expansion of the component to be mounted and a glass epoxy group substrate including a filler, such as glass fiber, for example, has been conventionally used for a circuit board. In contrast, the interposer of the present preferred embodiment, including less components than the first circuit board 102 or the second circuit board 202, does not have such restrictions, so that a material of which the effective relative dielectric constant is smaller than the effective relative dielectric constant of the first circuit board 102 and the second circuit board 202 is able to be used.

(l) In the third preferred embodiment, the plurality of conductor patterns 21, 22, and 23 overlap with the planar conductors 31 and 32, when viewed in the second direction (the Z axis direction). According to this configuration, by the shielding effect of the planar conductors 31 and 32, with respect to an article (the component 82, for example) or the like positioned on at least one side in the second direction when viewed from the interposer 303, unnecessary radiation from a signal line (the plurality of conductor patterns 21, 22, 23 and the interlayer connection conductors V21 and V22 that are electrically connected) is able to be significantly reduced or prevented, and/or the effect of noise from the outside (the component 82, for example) on the signal line is able to be significantly reduced or prevented. In addition, according to this configuration, in a case in which the stacking direction of the plurality of insulating base material layers to provide a stacked body is parallel or substantially parallel to the first direction (a direction in which the first element and the second element are spaced from each other), as compared with a configuration in which a plurality of interlayer connection conductors extending in the first direction are disposed around (on the side in the second direction with respect to the signal line) the signal line, the shielding performance with respect to the signal line is increased. Therefore, isolation between the signal line and the outside is able to be increased.

It is to be noted that, while the third preferred embodiment describes a configuration in which the plurality of conductor patterns 21, 22, and 23 entirely or substantially entirely overlap with the planar conductors 31 and 32, when viewed in the second direction (the Z axis direction), the present invention is not limited to this configuration. The above advantageous functions and effects are obtained as long as at least a portion of the plurality of conductor patterns overlaps with the planar conductor, when viewed in the second direction. However, in order to obtain the above advantageous functions and effects, it is preferable that the plurality of conductor patterns entirely or substantially entirely overlap with the planar conductor, when viewed in the second direction.

(m) In the third preferred embodiment, the plurality of planar conductors 31 and 32 are disposed at positions to interpose a signal line in the second direction (the Z axis direction). According to this configuration, the shielding effect of the planar conductor is further increased with respect to opposite sides of the second direction of the signal line. Therefore, with respect to an article (the component 82, for example) or the like positioned on opposite sides in the second direction when viewed from the interposer 303, unnecessary radiation from the signal line is able to be significantly reduced or prevented, and/or the effect of noise from the outside (the component 82, for example) on the signal line is able to be significantly reduced or prevented.

(n) Further, in the electronic device 403 according to the third preferred embodiment, the planar conductor 32 is at least partially located between the plurality of conductor patterns 21, 22, and 23 and the component 82. According to this configuration, by the shielding effect of the planar conductor, unnecessary radiation from a signal line to the component 82 is able to be significantly reduced or prevented, and/or the effect of noise from the component 82 on the signal line is able to be significantly reduced or prevented.

It is to be noted that, while the third preferred embodiment provides an example in which the three conductor patterns 21, 22, and 23 and the two interlayer connection conductors V21 and V22 define a signal line to connect the first electrode P1 and the second electrodes P2, the configuration of the signal line is not limited to such an example. The number of conductor patterns and the number of interlayer connection conductors are able to be appropriately changed in the scope in which the advantageous functions and effects of preferred embodiments of the present invention are obtained, and, for example, the signal line may be provided by four or more conductor patterns and three or more interlayer connection conductors.

Fourth Preferred Embodiment

A fourth preferred embodiment of the present invention provides an example in which a planar conductor is provided on a surface of a stacked body.

Figure 9:
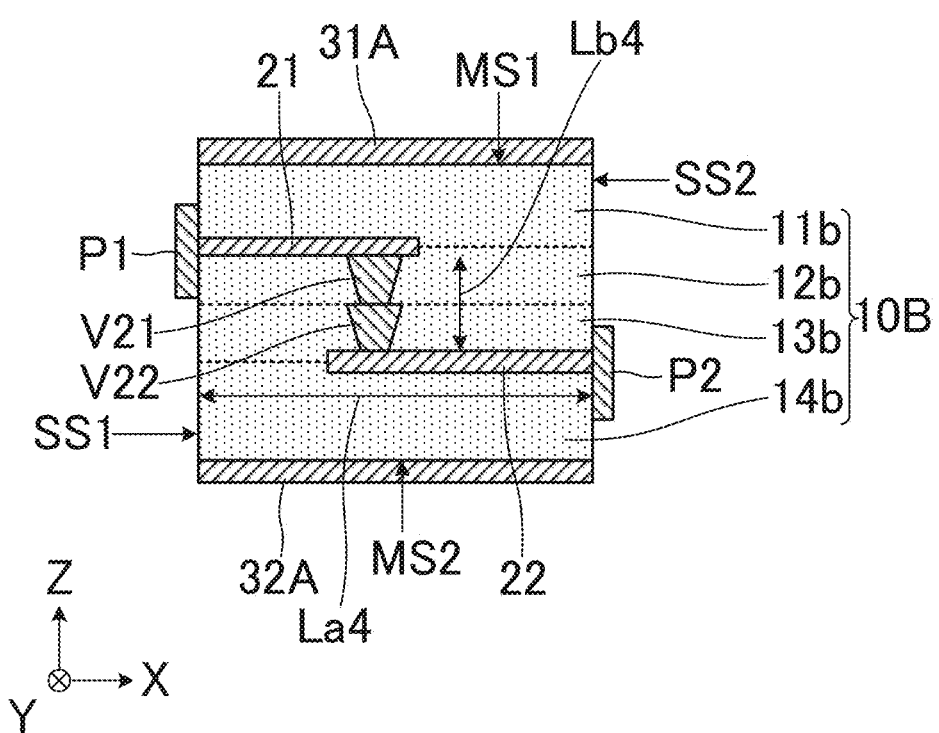
FIG. 9 is a cross-sectional view of an interposer 304 according to a fourth preferred embodiment of the present invention.

FIG. 9 is a cross-sectional view of an interposer 304 according to the fourth preferred embodiment of the present invention.

The interposer 304 includes a stacked body 10B, a plurality of conductor patterns 21 and 22, planar conductors 31A and 32A, interlayer connection conductors V21 and V22, a first electrode P1, and a second electrode P2.

The interposer 304 is different from the interposer 302 according to the second preferred embodiment in terms of including a stacked body 10B and planar conductors 31A and 32A. In addition, the interposer 304 is different from the interposer 302 in the number of interlayer connection conductors. Other configurations of the interposer 304 are the same or substantially the same as the configurations of the interposer 302.

Hereinafter, the differences from the interposer 302 according to the second preferred embodiment will be described.

The stacked body 10B is a rectangular or substantially rectangular parallelepiped shaped insulator including a plurality of flexible insulating base material layers 11b, 12b, 13b, and 14b that are stacked on one another. The stacked body 10B includes a first main surface MS1 and a second main surface MS2 that face each other. The first main surface MS1 and the second main surface MS2 are perpendicular or substantially perpendicular to the stacking direction (the Z axis direction) of the plurality of insulating base material layers 11b to 14b. The insulating base material layers 11b to 14b are the same or substantially the same as the insulating base material layers 11, 12, and 13 described in the first preferred embodiment.

The plurality of conductor patterns 21 and 22 are provided in the stacked body 10B and extending in a first direction (an X axis direction shown in FIG. 9, for example) perpendicular or substantially perpendicular to the end surface SS1 (the first mounting surface) and the end surface SS2 (the second mounting surface). The planar conductor 31A is provided on the entire or substantially the entire first main surface MS1, and the planar conductor 32A is provided on the entire or substantially the entire second main surface MS2. The planar conductors 31A and 32A are preferably plating films such as Cu films formed by electroless plating (or electroplating), for example.

The plurality of conductor patterns 21 and 22 entirely or substantially entirely overlap (not shown) with the planar conductors 31A and 32A, when viewed in the second direction (the Z axis direction). In addition, the planar conductors 31A and 32A are disposed at positions to interpose the plurality of conductor patterns 21 and 22 or the interlayer connection conductors V21 and V22 in the second direction (the Z axis direction).

The interlayer connection conductors V21 and V22 are provided in the stacked body 10B and extend in a second direction (the Z axis direction shown in FIG. 9) parallel or substantially parallel to the end surface SS1 (the first mounting surface) and the end surface SS2 (the second mounting surface), and connect the plurality of conductor patterns 21 and 22. The interlayer connection conductors V21 and V22 are via conductors provided by forming an opening in the insulating base material layer with a laser or any other suitable method, for example, then providing (filling) the opening with conductive paste including one or more of Cu, Sn, and the like or an alloy including one or more of Cu, Sn, and the like, and then solidifying the conductive paste through the subsequent thermal pressing in the stacking process.

As shown in FIG. 9, each of the interlayer connection conductors V21 and V22 is provided on a different insulating base material layer. It is to be noted that, in the fourth preferred embodiment, the plurality of interlayer connection conductors V21 and V22 overlap with each other, when viewed in the second direction (the Z axis direction).

The first electrode P1 and the second electrode P2 are electrically connected to each other through the plurality of conductor patterns 21 and 22 and the interlayer connection conductors V21 and V22. Specifically, as shown in FIG. 9, the first electrode P1 is connected to one end of the conductor pattern 21. The other end of the conductor pattern 21 is connected to one end of the conductor pattern 22 through the interlayer connection conductors V21 and V22, and the other end of the conductor pattern 22 is connected to the second electrode P2.

In this manner, in the fourth preferred embodiment, the plurality of conductor patterns 21 and 22 and the interlayer connection conductors V21 and V22 that are electrically connected to each other provide wiring (a signal line) to connect the first electrode P1 and the second electrode P2.

In the fourth preferred embodiment, the conductor pattern 21, the planar conductors 31A and 32A, the insulating base material layers 11b interposed between the conductor pattern 21 and the planar conductor 31A, and the insulating base material layers 12b, 13b, and 14b interposed between the conductor pattern 21 and the planar conductor 32A define a transmission line of a stripline structure. In addition, the conductor pattern 22, the planar conductors 31A and 32A, the insulating base material layers 11b, 12b, and 13b interposed between the conductor pattern 22 and the planar conductor 31A, and the insulating base material layer 14b interposed between the conductor pattern 22 and the planar conductor 32A define a transmission line of a stripline structure.

Even with such a configuration, the advantageous functions and effects the same as or similar to the functions and effects of the interposer 303 according to the third preferred embodiment are obtained.

Fifth Preferred Embodiment

A fifth preferred embodiment of the present invention provides an example of an interposer including a partially bent stacked body.

Figure 10:
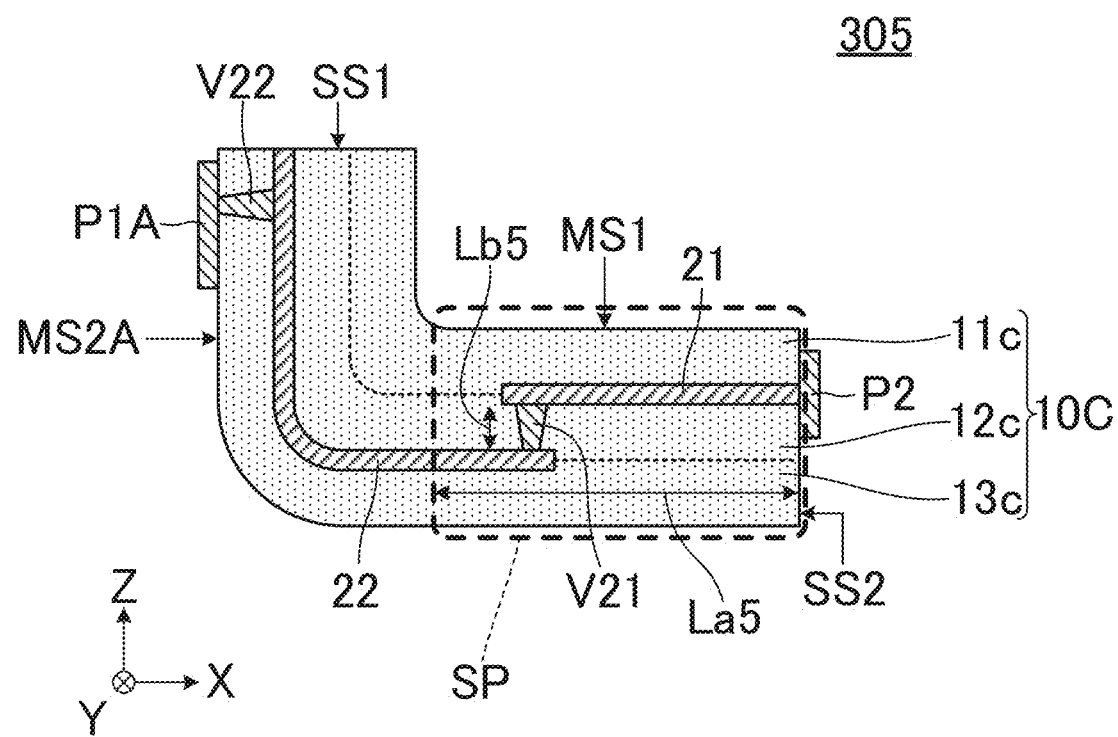
FIG. 10 is a cross-sectional view of an interposer 305 according to a fifth preferred embodiment of the present invention.
Figure 11:
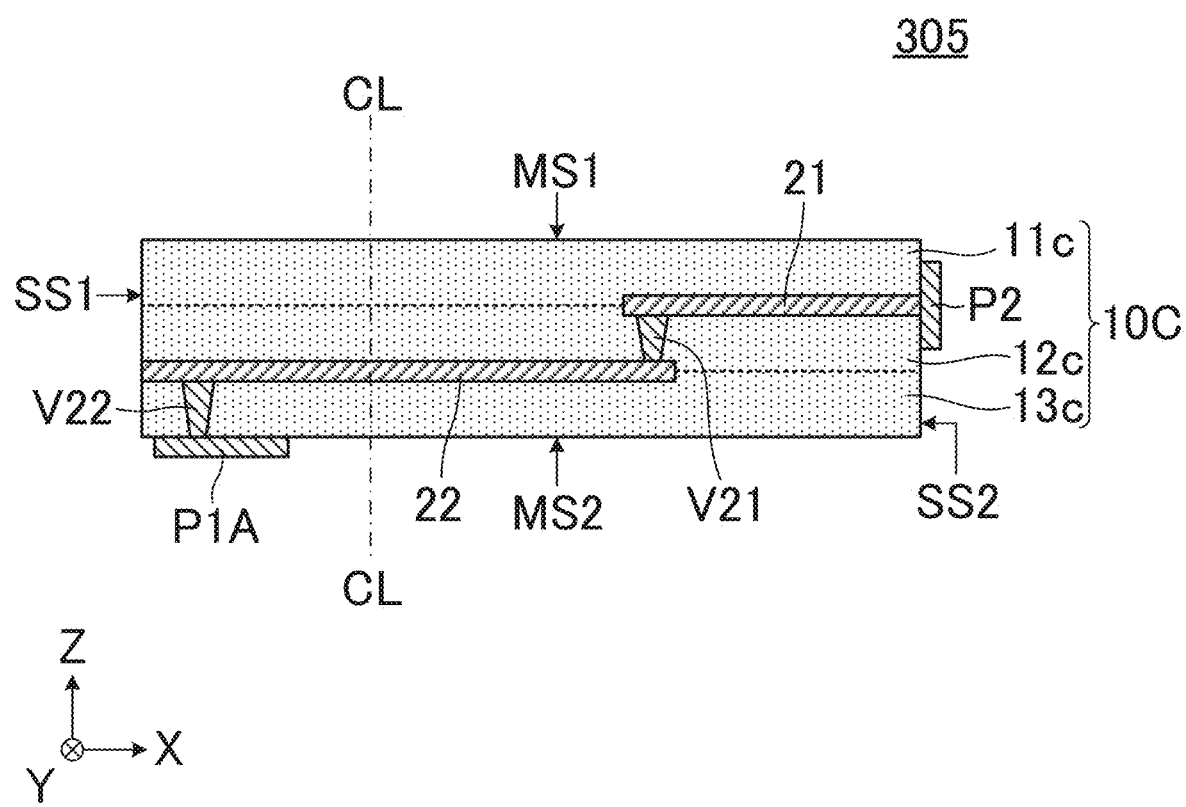
FIG. 11 is a cross-sectional view showing a state before the interposer 305 is bent.

FIG. 10 is a cross-sectional view of an interposer 305 according to the fifth preferred embodiment of the present invention. FIG. 11 is a cross-sectional view showing a state before the interposer 305 is bent.

The interposer 305 is different from the interposer 302 according to the second preferred embodiment in terms of including a stacked body 10C, a first electrode P1A, and a plurality of interlayer connection conductors V21 and V22. Other configurations of the interposer 305 are the same or substantially the same as the configurations of the interposer 302.

Hereinafter, the differences from the interposer 302 according to the second preferred embodiment will be described.

The stacked body 10C is a partially bent L-shaped insulator including a plurality of flexible insulating base material layers 11c, 12c, and 13c that are stacked on one another. The stacked body 10C includes a second main surface MS2A and an end surface SS2 that are parallel or substantially parallel to each other. It is to be noted that, in the fifth preferred embodiment, a portion of the second main surface MS2A and a portion of the end surface SS2 face each other. The end surface SS2 is (an end surface of the stacked body 10C) parallel or substantially parallel to the stacking direction (the Z axis direction) of the plurality of insulating base material layers 11c, 12c, and 13c.

In the fifth preferred embodiment, the second main surface MS2A of the stacked body 10C corresponds to the "first mounting surface", and the end surface SS2 of the stacked body 10C corresponds to the "second mounting surface".

The partially bent stacked body 10C is obtained, for example, by bending the stacked body 10C (a rectangular or substantially rectangular flat plate of which the long side direction coincides with the X axis direction) having a rectangular or substantially rectangular parallelepiped shape shown in FIG. 11 in an L shape along a bending line CL (a dashed-dotted line in FIG. 11), while being thermally pressed. As a result, a stacked body that maintains (holds) a bent shape is obtained. A portion of the second main surface MS2 of the stacked body 10C shown in FIG. 11 is bent, and defines and functions as the second mounting surface (the second main surface MS2A) of the stacked body 10C shown in FIG. 10.

The partially bent stacked body 10C includes an upright portion SP. The upright portion SP refers to a portion in which the stacking direction of the plurality of insulating base material layers 11c, 12c, and 13c is parallel or substantially parallel to the first mounting surface (the second main surface MS2A) and the second mounting surface (the end surface SS2).

The plurality of conductor patterns 21 and 22 are provided in the stacked body 10C. In the upright portion SP, the plurality of conductor patterns 21 and 22 extend in a first direction (the X axis direction shown in FIG. 10, for example) perpendicular or substantially perpendicular to the second main surface MS2A (the first mounting surface) and the end surface SS2 (the second mounting surface).

The interlayer connection conductors V21 and V22 are provided in the stacked body 10C. In the upright portion SP, the interlayer connection conductor V21 extends in a second direction (the Z axis direction shown in FIG. 10) parallel or substantially parallel to the second main surface MS2A (the first mounting surface) and the end surface SS2 (the second mounting surface), and connects the plurality of conductor patterns 21 and 22. It is to be noted that the interlayer connection conductor V22 extends in the first direction (the X axis direction) perpendicular or substantially perpendicular to the second main surface MS2A (the first mounting surface) and the end surface SS2 (the second mounting surface). The interlayer connection conductors V21 and V22 are via conductors provided by, for example, forming an opening in the insulating base material layer with a laser or any other suitable method, then providing (filling) the opening with conductive paste including one or more of Cu, Sn, and the like or an alloy including one or more of Cu, Sn, and the like, and then solidifying the conductive paste through the subsequent thermal pressing in the stacking process.

In addition, the interlayer connection conductors V21 and V22 are provided on different insulating base material layers. Specifically, the interlayer connection conductor V21 is provided in the insulating base material layer 12c, and the interlayer connection conductor V22 is provided in the insulating base material layer 13c.

The first electrode P1A is a conductor pattern provided on the second main surface MS2A (the first mounting surface), and the second electrode P2 is a conductor pattern provided on the end surface SS2 (the second mounting surface). The first electrode P1A is a conductor pattern such as Cu foil, for example, and the second electrode P2 is a plating film such as a Cu film formed by electroless plating (or electroplating), for example.

The first electrode P1A and the second electrode P2 are electrically connected to each other through the plurality of conductor patterns 21 and 22 and the interlayer connection conductors V21 and V22. Specifically, as shown in FIG. 10, the first electrode P1A is connected to one end of the conductor pattern 22 through the interlayer connection conductor V22. The other end of the conductor pattern 22 is connected to one end of the conductor pattern 21 through the interlayer connection conductor V21. The other end of the conductor pattern 21 is connected to the second electrode P2.

In this manner, in the fifth preferred embodiment, the plurality of conductor patterns 21 and 22 and the interlayer connection conductors V21 and V22 that are electrically connected to each other provide wiring (a signal line) to connect the first electrode P1A and the second electrode P2.

In addition, as shown in FIG. 10, in the upright portion SP, a length La5 in the first direction (the X axis direction) is larger than a total length Lb5 in the second direction (the Z axis direction) of the interlayer connection conductor V21 (La5>Lb5). In other words, in the wiring to connect the first electrode P1 and the second electrode P2, a length of wiring (the plurality of conductor patterns 21 and 22) extending in the first direction (the X axis direction) in the upright portion SP is larger than a length of wiring (the interlayer connection conductor V21) extending in the second direction (the Z axis direction) in the upright portion SP.

In this manner, even the partially bent stacked body, as long as the upright portion includes the above described configuration, obtains the advantageous functions and effects that are the same as or similar to the functions and effects of the interposer 302 according to the second preferred embodiment. It is to be noted that, according to the interposer 305 of the fifth preferred embodiment of the present invention, the following advantageous effects in addition to the advantageous effects described in the second preferred embodiment are obtained.

(o) In the fifth preferred embodiment, the first electrode P1A is provided on a portion of a main surface (a surface perpendicular or substantially perpendicular to the stacking direction of the stacked body, the second main surface MS2 of the stacking body 10C shown in FIG. 11) of the stacked body 10C. According to this configuration, as compared with a case in which a first electrode is provided on the end surface of the stacked body, the area of the first electrode is easily increased. Therefore, by increasing the area of the first electrode, the mountability of the interposer to the first element is improved, so that the bonding strength (the bonding strength between the first electrode P1A and the land of the first element) between the interposer and the first element is able to be increased. It is to be noted that, in a case in which the second electrode is provided on a portion of the main surface of the stacked body, the area of the second electrode is easily increased, so that the mountability of the interposer to the first element is able to be improved.

(p) In addition, in the interposer 305 according to the fifth preferred embodiment, the stacked body 10C has flexibility and includes the bent portion. According to this configuration, the interposer (the stacked body) is easily deformed by using the flexibility of the stacked body 10C itself or the bent portion. Therefore, even when the distance (the distance in the first direction) between the first element and the second element slightly varies for each electronic device, by changing (finely adjusting) the length in the first direction of the interposer, the interposer is able to be easily disposed between the first element and the second element. In addition, according to this configuration, the interposer is connected to the first element or the second element by using the flexibility of the stacked body 10C itself or the bent portion, so that stress or the like applied to the first element or the second element is not easily transmitted to a bonding portion (a bonding portion between the first electrode P1A and the land of the first element, a bonding portion between the electrode P2 and the land of the second element). Accordingly, damage or the like to the bonding portion due to the stress or the like applied to the first element or the second element is significantly reduced or prevented, and the reliability of connection between the first element (or the second element) and the interposer is able to be increased.

It is to be noted that, while the fifth preferred embodiment provides an example in which a portion of the first mounting surface (the second main surface MS2A) faces a portion of the second mounting surface (the end surface SS2), the present invention is not limited to such a configuration. The first mounting surface and the second mounting surface need not necessarily face each other and may be parallel or substantially parallel to each other. Further, while the fifth preferred embodiment provides an example in which the "first mounting surface" is the second main surface MS2A of the stacked body 10C and the "second mounting surface" is the end surface SS2, the present invention is not limited to this example. For example, the "first mounting surface" may be an end surface of the stacked body, and the "second mounting surface" may be either one of the first main surface and the second main surface of the stacked body.

In addition, while the fifth preferred embodiment provides an example in which the stacked body 10C is bent in an L shape, the shape of a bent stacked body is not limited to this example. The shape of a bent stacked body is able to be appropriately changed within the scope of the advantageous functions and effects of the fifth embodiments of the present invention. In addition, a portion, a direction, and the like in which the stacked body is to bent are not limited to the configuration described in the fifth preferred embodiment, and are able to be appropriately changed within the scope of the advantageous functions and effects of the preferred embodiments of the present invention.

While each of the above preferred embodiments provides an example in which the entire or substantially the entire interposer is disposed (interposed) between the first element (the first circuit board) and the second element (the second circuit board), the present invention is not limited to such a configuration. A portion of the interposer may be disposed between the first element and the second element.

It is to be noted that, while each of the above preferred embodiments provides an example in which the interposer and the first element (the first circuit board) are directly connected through solder, the interposer and the first element may be connected through a connector. For example, a plug may be mounted on the first mounting surface of the interposer, a receptacle may be mounted on the first element, and the interposer and the first element may be electrically and mechanically connected to each other by fitting the plug to the receptacle. In addition, the interposer and the second element may be connected through a connector. However, in view of the foregoing advantageous functions and effects (see the above (e)), the interposer and the first element are preferably directly connected through solder, and the interposer and the second element are preferably directly connected through solder.

While each of the above described preferred embodiments provides an example in which the stacked body has a rectangular parallelepiped shape, the present invention is not limited to such a configuration. The shape of the stacked body is able to be appropriately changed within the scope of advantageous functions and effects of the preferred embodiments of the present invention, and, for example, the plane shape of the stacked body may include a polygon, a circle, an ellipse, an L shape, a T shape, a Y shape, and a crank shape, for example.

While each of the above described preferred embodiments provides an example of a stacked body obtained by stacking three, four, or seven insulating base material layers on one another, the present invention is not limited to such a configuration. The number of stacked layers of the insulating base material layers defining a stacked body is able to be appropriately changed within the scope of advantageous functions and effects of the preferred embodiments of the present invention, and may be two, five, or six, for example, or may be eight or more.

While each of the above described preferred embodiments provides an example in which the stacked body is provided by stacking the plurality of insulating base material layers made of a thermoplastic resin, the present invention is not limited to such a configuration. Each of the insulating base material layers, for example, may be a sheet made of a thermosetting resin such as an epoxy resin or may be a protective layer such as a solder resist film or a cover lay film. The stacked body may include a composite material including a plurality of resin materials or may be provided by stacking a thermosetting resin such as a glass epoxy substrate and a thermoplastic resin. In addition, the stacked body is not limited to a stacked body including stacked insulating base material layers of which the surfaces are fused by thermal pressing, and may include an adhesive layer between respective insulating base material layers.

While each of the above preferred embodiments provides an example in which the interposer includes only an electrode (the first electrode, the second electrode, and the ground electrode) to electrically connect the first element (the first circuit board) and the second element (the second circuit board), the present invention is not limited to such a configuration. For example, the interposer may include an auxiliary electrode (an electrode that does not electrically connect a first element and a second element). The configuration including an auxiliary electrode, even when the interposer has an elongated shape, enables the interposer to be solder-mounted on the first element or the second element, as with other components.

While each of the above described preferred embodiments provides an example of the interposer in which the plurality of conductor patterns are provided in the stacked body, the present invention is not limited to such a configuration. A portion of the plurality of conductor patterns may be provided on the surface of the stacked body.

It is to be noted that the circuit configuration provided on the interposer (the stacked body) is not limited to the configuration described in each of the preferred embodiments. The circuit provided on the interposer is able to be appropriately changed within the scope of advantageous operations and features of the preferred embodiments of the present invention.

The interposer may include an inductor or a capacitor other than a signal line that are provided by a conductor pattern, for example. Further, the interposer may include a frequency filter including various filters (a low pass filter, a high pass filter, a band pass filter, or a band elimination filter). In addition, the interposer may include various transmission lines (such as a microstrip line and a coplanar line) having a structure other than the stripline structure.

Further, the interposer of preferred embodiments of the present invention may be configured such that various types of components such as a chip component may be mounted (or embedded).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An interposer disposed between a first element and a second element and electrically connecting the first element and the second element, the interposer comprising:
   a stacked body including a plurality of insulating base material layers stacked on one another, being partially bent, and including a first mounting surface and a second mounting surface that face each other;
   a plurality of conductor patterns in the stacked body and extending in a first direction perpendicular or substantially perpendicular to the first mounting surface and the second mounting surface;
   an interlayer connection conductor in the stacked body, extending in a second direction parallel or substantially parallel to the first mounting surface and the second mounting surface, and connecting the plurality of conductor patterns;
   a first electrode on the first mounting surface; and
   a second electrode on the second mounting surface and electrically connected to the first electrode through the plurality of conductor patterns and the interlayer connection conductor; wherein
   the first mounting surface and the second mounting surface are parallel or substantially parallel to a stacking direction in which the plurality of insulating base material layers are stacked; and
   a length between the first mounting surface and the second mounting surface in the first direction is larger than a total length of the interlayer connection conductor in the second direction.

2. The interposer according to claim 1, wherein the plurality of conductor patterns and the interlayer connection conductor are bonded by solid state diffusion bonding.

3. The interposer according to claim 1, wherein the interlayer connection conductor is plated metal.

4. The interposer according to claim 1, wherein
   the plurality of insulating base material layers are made of a resin as a main material; and
   the interlayer connection conductor includes a resin material.

5. The interposer according to claim 1, wherein
   the plurality of insulating base material layers are made of a resin as a main material;
   the interlayer connection conductor includes a plurality of interlayer connection conductors each of which is provided on a different insulating base material layer; and
   the plurality of interlayer connection conductors do not overlap with each other, when viewed in the second direction.

6. The interposer according to claim 1, further comprising:
   a planar conductor provided in the stacked body; and
   the plurality of conductor patterns are at least partially overlapped with the planar conductor, when viewed in the second direction.

7. The interposer according to claim 6, wherein
   the planar conductor includes a plurality of planar conductors; and
   the plurality of planar conductors interpose the plurality of conductor patterns or the interlayer connection conductor in the second direction.

8. The interposer according to claim 1, wherein the plurality of insulating base material layers are made of a thermoplastic resin.

9. An interposer disposed between a first element and a second element and electrically connecting the first element and the second element, the interposer comprising:
   a stacked body including a plurality of insulating base material layers stacked on one another, being partially bent, and including a first mounting surface and a second mounting surface that are parallel or substantially parallel to each other;
   a plurality of conductor patterns in the stacked body;
   an interlayer connection conductor in the stacked body;
   a first electrode on the first mounting surface; and
   a second electrode on the second mounting surface and electrically connected to the first electrode through the plurality of conductor patterns and the interlayer connection conductor; wherein the stacked body includes an upright portion in which a stacking direction in which the plurality of insulating base material layers are stacked is parallel or substantially parallel to the first mounting surface and the second mounting surface;

in the upright portion, the plurality of conductor patterns extend in a first direction perpendicular or substantially perpendicular to the first mounting surface and the second mounting surface;

in the upright portion, the interlayer connection conductor extends in a second direction parallel or substantially parallel to the first mounting surface and the second mounting surface, and connects the plurality of conductor patterns; and in the upright portion, a length in the first direction is larger than a total length of the interlayer connection conductor in the second direction.

10. The interposer according to claim 9, wherein either one of the first mounting surface and the second mounting surface is an end surface of the stacked body parallel or substantially parallel to the stacking direction.

11. The interposer according to claim 9, wherein the plurality of conductor patterns and the interlayer connection conductor are solid state diffusion bonded.

12. The interposer according to claim 9, wherein the interlayer connection conductor is plated metal.

13. The interposer according to claim 9, wherein
the plurality of insulating base material layers are made of a resin as a main material; and
the interlayer connection conductor includes a resin material.

14. The interposer according to claim 9, wherein
the plurality of insulating base material layers are made of a resin as a main material;
the interlayer connection conductor includes a plurality of interlayer connection conductors each of which is provided on a different insulating base material layer; and
the plurality of interlayer connection conductors do not overlap with each other, when viewed in the second direction.

15. The interposer according to claim 9, further comprising:
a planar conductor provided in the stacked body; and
the plurality of conductor patterns are at least partially overlapped with the planar conductor, when viewed in the second direction.

16. The interposer according to claim 15, wherein
the planar conductor includes a plurality of planar conductors; and
the plurality of planar conductors interpose the plurality of conductor patterns or the interlayer connection conductor in the second direction.

17. The interposer according to claim 9, wherein the plurality of insulating base material layers are made of a thermoplastic resin.

18. An electronic device comprising:
a first element;
a second element; and
an interposer disposed between the first element and the second element and electrically connecting the first element and the second element, the interposer comprising:
a stacked body including a plurality of insulating base material layers stacked on one another, being partially bent, and including a first mounting surface and a second mounting surface that face each other;

a plurality of conductor patterns in the stacked body and extending in a first direction perpendicular or substantially perpendicular to the first mounting surface and the second mounting surface;
an interlayer connection conductor in the stacked body, extending in a second direction parallel or substantially parallel to the first mounting surface and the second mounting surface, and connecting the plurality of conductor patterns;
a first electrode on the first mounting surface; and
a second electrode on the second mounting surface and electrically connected to the first electrode through the plurality of conductor patterns and the interlayer connection conductor; wherein
the first mounting surface and the second mounting surface are parallel or substantially parallel to a stacking direction in which the plurality of insulating base material layers are stacked;
a length between the first mounting surface and the second mounting surface in the first direction is larger than a total length of the interlayer connection conductor in the second direction; and
the first electrode is electrically connected to the first element, and the second electrode is electrically connected to the second element.

19. The electronic device according to claim 18, wherein the stacked body has a smaller effective elastic modulus than the first element and the second element.

20. The electronic device according to claim 18, further comprising a component mounted on the first element or the second element and disposed between the first element and the second element.

21. The electronic device according to claim 20, wherein
the interposer includes a planar conductor in the stacked body; and
the planar conductor is at least partially disposed between the plurality of conductor patterns and the component.

22. An electronic device comprising:
a first element;
a second element; and
an interposer disposed between the first element and the second element and electrically connecting the first element and the second element, the interposer comprising:
a stacked body including a plurality of insulating base material layers that are stacked on one another, being partially bent, and including a first mounting surface and a second mounting surface that are parallel or substantially parallel to each other;
a plurality of conductor patterns in the stacked body;
an interlayer connection conductor in the stacked body;
a first electrode on the first mounting surface; and
a second electrode on the second mounting surface and electrically connected to the first electrode through the plurality of conductor patterns and the interlayer connection conductor; wherein
the stacked body includes an upright portion in which a stacking direction in which the plurality of insulating base material layers are stacked is parallel or substantially parallel to the first mounting surface and the second mounting surface;
in the upright portion, the plurality of conductor patterns extend in a first direction perpendicular or substantially perpendicular to the first mounting surface and the second mounting surface;
in the upright portion, the interlayer connection conductor extends in a second direction parallel or substantially parallel to the first mounting surface and the second mounting surface, and connects the plurality of conductor patterns;

in the upright portion, a length in the first direction is larger than a total length of the interlayer connection conductor in the second direction; and the first electrode is electrically connected to the first element, and the second electrode is electrically connected to the second element.

23. The electronic device according to claim 22, wherein the stacked body has a smaller effective elastic modulus than the first element and the second element.

24. The electronic device according to claim 22, further comprising a component mounted on the first element or the second element and disposed between the first element and the second element.

25. The electronic device according to claim 24, wherein the interposer includes a planar conductor in the stacked body; and the planar conductor is at least partially disposed between the plurality of conductor patterns and the component.

* * * * *